United States Patent [19]

Sato

[11] Patent Number: 5,579,251
[45] Date of Patent: Nov. 26, 1996

[54] IC TESTER

[75] Inventor: Kazuhiko Sato, Gyoda, Japan

[73] Assignee: Advantest Corporation, Japan

[21] Appl. No.: 142,472

[22] PCT Filed: Mar. 29, 1993

[86] PCT No.: PCT/JP93/00381

§ 371 Date: Nov. 29, 1993

§ 102(e) Date: Nov. 29, 1993

[87] PCT Pub. No.: WO93/20457

PCT Pub. Date: Oct. 14, 1993

[30] Foreign Application Priority Data

Mar. 31, 1992 [JP] Japan ................... 4-076715
Mar. 31, 1992 [JP] Japan ................... 4-076721

[51] Int. Cl.⁶ .............................. G06F 11/00; G01R 31/28
[52] U.S. Cl. ........................ 364/579; 371/22.1; 371/25.1; 371/27
[58] Field of Search .................... 364/579; 371/15.1, 371/16.1, 21.1, 22.1, 22.4, 25.1, 27; 324/73.1, 158.1

[56] References Cited

U.S. PATENT DOCUMENTS

| | | | |
|---|---|---|---|
| 4,450,560 | 5/1984 | Conner | 371/25.1 |
| 4,656,632 | 4/1987 | Jackson | 371/25.1 |
| 4,860,291 | 8/1989 | Damm et al. | 371/27 |
| 4,928,278 | 5/1990 | Otsuji et al. | 364/579 |
| 5,142,223 | 8/1992 | Higashino et al. | 371/22.1 |

FOREIGN PATENT DOCUMENTS

| | | |
|---|---|---|
| 3844036C2 | 8/1991 | Germany. |
| 57-116269 | 7/1982 | Japan. |
| 1-138477 | 5/1989 | Japan. |
| 2-6762 | 1/1990 | Japan. |

*Primary Examiner*—Emanuel T. Voeltz
*Assistant Examiner*—Eric W. Stamber
*Attorney, Agent, or Firm*—Staas & Halsey

[57] ABSTRACT

Each of test channels $CH_1$–$CH_N$ includes a level/timing comparator section $20_1$–$20_N$ for making a logic decision on the level of an input signal at strobes STRB1 and STRB2, and a logic comparator section $30_1$–$30_N$ for making a logic comparison between the result of the logic decision and an expected value signal $EXP_1$–$EXP_N$ to output or inhibit the result of the logic comparison in accordance with comparison control signals CPE1, CPE2. Further, there are provided mode switching circuits $8_1$–$8_N$ and mode switching signal generators $13_1$–$13_N$. Each of the mode switching circuits alters the comparison control signals CPE1, CPE2 as desired by mode switching signals CONT1, CONT2 and CONT3 of the corresponding test channels and logic operations, and controls whether or not to apply the altered comparison control signals to the corresponding logic comparator sections $30_1$–$30_N$ in accordance with the pin control signals of the corresponding test channels.

16 Claims, 16 Drawing Sheets

| MODE | CONT1 | CONT2 | CONT3 | CONT4 |
|---|---|---|---|---|
| MULTIPLEX MODE | 0 | 1 | 0 | 0 |
| MASKING MODE | 0 | 0 | 0 | 0 |
| INDIVIDUAL PIN CONTROL MODE | 1 | 0 | 0 | 0 |
| CONVENTIONAL MODE | 0 | 0 | 1 | 0 |
| EXCLUSIVE-OR MODE | 0 | 0 | 0 | 1 |

IC TESTER

BACKGROUND OF THE INVENTION

1. Field of the Invention

This invention relates generally to an IC tester for testing IC's such as memory IC's, logic IC's, memory IC's having a built-in logic circuit, and particularly to logic comparison for comparing an output response from an IC with an expected value.

2. Background Art

FIG. 1 illustrates a schematic diagram of a prior art IC tester in which an IC to be tested is indicated by 10.

A pattern generating section 11 comprises an algorithmic pattern generator 11A, a random pattern memory 11B, a multiplexer 11C, a control part 11D, a multiplexer 11E, and a comparison control signal generator 11F. The algorithmic pattern generator 11A generates relatively regular algorithmic pattern data AP by a logic operation in synchronism with a clock signal CK from a timing generator 12. The algorithmic pattern data AP is primarily used to generate a pattern to be applied for testing a memory, an address pattern and an expected value pattern. The random pattern memory 11B reads out a prestored random pattern RP in synchronism with the clock signal CK. The random pattern RP is primarily used to generate a pattern to be applied for testing a logic circuit and an expected value pattern. No reference will be made to the generation of the applied pattern and the address pattern, since this invention is particularly concerned with the comparison between a response output from an IC being tested and an expected value.

The multiplexer 11C is supplied with algorithmic pattern data AP from the algorithmic pattern generator 11A and a random pattern RP from the random pattern memory 11B and produces two sequences of pattern data DA and DB each having K bits by either selecting one of the data AP and RP, or combining desired portions of these data AP and RP, or taking a logical AND, a logical OR, or an exclusive-OR of the data AP and RP, in accordance with a control signal MCNT from the control part 11D. The multiplexer 11E selects and outputs the data at a desired bit position of specified one of the two sequences of the pattern data DA and DB to each of the output bit positions of the multiplexer 11E such that the outputs of N bits corresponding to N test channels $CH_1$-$CH_N$ are provided as desired expected value signals $EXP_1$-$EXP_N$. This selection is designated by a data selecting signal DSEL and a bit selecting signal BSEL produced at a pin control interface 14. The expected value signals $EXP_1$-$EXP_N$ thus output from the multiplexer 11E are provided to logic comparator sections $30_1$-$30_N$ of the corresponding test channels $CH_1$-$CH_N$. Generating the two sequences of the pattern data DA and DB permits the use of those data to compound expected patterns having a greater number of bits than the K bits of each of the data DA and DB, for example.

Although not shown, the multiplexer 11E is equipped therein with registers each corresponding to one of the test channels. Bit selecting signals BSEL (plural bits) and data selecting signals DSEL (one bit) are set in those registers, and for each of the individual test channels, data at a specified bit position of the data DA or DB as specified by those select signals having been set are output as expected value signals.

Connected to N terminal pins of an IC 10 to be tested are level/timing comparator sections $20_1$-$20_N$ of N test channels $CH_1$-$CH_N$, respectively. The outputs of the level/timing comparator sections $20_1$-$20_N$ are connected to logic comparator sections $30_1$-$30_N$. It is noted that the suffixes of the reference numerals 20 and 30 and the reference symbols CH and EXP represent the channel number. Each level/timing comparator section, say the comparator section $20_1$ and the associated logic comparator section $30_1$ constitute one test channel. When any one of the channels is representatively described in the following descriptions, the suffix representing the channel number may be omitted. Each level/timing comparator section 20 logically determines the output from a corresponding pin of the IC 10 under test at the timings of strobes STRB1 and STRB2 from the timing generator 12.

The logic comparator sections $30_1$-$30_N$ are each equipped with exclusive-OR circuits XOR1 and XOR2 for detecting a non-coincidence, and AND gates AND1 and AND2 for controlling the outputs of the detected results. One of the input terminals of each of the exclusive-OR circuits XOR1 and XOR2 is provided with the logically determined output of the associated one of the level/timing comparator sections $20_1$, $20_2$, $20_N$ while the others of the input terminals of the exclusive-OR circuits XOR1 and XOR2 are connected in common to be provided with the expected value signals $EXP_1$-$EXP_N$. If the result of logic decision and the expected value are in coincidence, an L level is output, and if they are not in coincidence, an H level is output.

The comparison results of the exclusive-OR circuits XOR1 and XOR2 are applied to the AND gates AND1 and AND2, respectively, where it is decided by comparison control signals CPE1 and CPE2 whether or not to output the logic comparison results. The logic comparison results are used to evaluate the defect analysis property of an IC under test or determine the quality thereof, but a further description thereon is omitted as it is not directly related to this invention.

While in FIG. 1, the level/timing comparator sections $20_1$, $20_2$, ... $20_N$ and the logic comparator sections $30_1$, $30_2$, $30_N$ ... are only diagramatically shown, their actual constructions are similar to those shown in U.S. Pat. No. 4,862,071. For example, each comparator section is constructed as illustrated in FIG. 2 for one test channel.

In FIG. 2, each of pin outputs $D_0$ of the IC 10 under test is compared with a H reference level $V_H$ and a L reference level $V_L$ at the H level comparator $21C_H$ and L level comparator $21C_L$, respectively, of the level/timing comparator section 20. If the output $D_0$ is higher than the reference level $V_H$, the outputs of the comparators 21C and $21C_L$ will be at L and H levels, respectively. If the output $D_0$ is lower than the reference level $V_L$, the outputs of the comparators $21C_H$ and $21C_L$ will be at H and L levels, respectively. The level comparison outputs of these comparators on the H level side and the L level side are extracted by strobes STRB1 and STRB2 of different timings, respectively in the strobe circuits 21S H level side and in the strobe circuits $21S_{H1}$ and $21S_{H2}$ and the strobe circuits $21S_{L1}$ and $21S_{L2}$, respectively. That is, the results of logic decision at particular timings are sampled, and the sampled logics are logically compared with the excepted values EXP and their inverted logics in the AND circuits $31_{H1}$ and $31_{H2}$ and in the AND circuits $31_{L1}$ and $31_{L2}$. In this example, on either of the H logic side ($21_{CL}$, $21S_{L1}$, $21S_{H2}$, $31_{H1}$, $31_{H2}$) and the L logic side ($21C_L$, $21S_{L1}$, $21S_{L2}$, $31_{L1}$, $B1_{L2}$), L level outputs are generated if the sampled logics are correct ones, so that if the expected value EXP is at the H level, the AND circuits $31_{H1}$, $31_{H2}$ and the AND circuits $31_{L1}$, $31_{L2}$ will generate L level outputs. When the expected value EXP is at the L level as well, the AND circuits $31_{H1}$, $31_{H2}$ and the AND circuits $31_{L1}$, $31_{L2}$ will generate L level outputs if the sampled logics are correct ones. The AND circuits $31_{H1}$, $31_{H2}$ and the AND circuits $31_{L1}$, $31_{L2}$ act to control in accordance with the control signals CPE1 and CPE2 whether or not to output the comparison results. As illustrated in FIG. 2, the test channels are so arranged that the H logic tests and L logic tests may be conducted separately and that logic tests may be carried out at two different timings for each of the H and L logics. It is noted that the strobe circuits ST1 and ST2 of each of the test channels diagramatically shown in FIG. 1 correspond to the level comparators $21C_H$ and $21C_L$ and the strobe circuits $21S_{H1}$, $21S_{H2}$ and $21S_{L1}$, $21S_{L2}$ shown in FIG. 2. The exclusive-OR circuits XOR1 and XOR2 of FIG. 1 correspond to the AND circuits $31_{H1}$, $31_{H2}$, $31_{L1}$, $31_{L2}$ of FIG. 2. The AND gates AND1, AND2 of FIG. 1 correspond to the AND gates $32_{H1}$, $32_{H2}$, $32_{L1}$, $32_{L2}$ of FIG. 2.

Further, the arrangements are such that the comparison results obtained with the strobes STRB1 and STRB2 may be taken separately from OR gates 33S1 and 33S2, as required. The outputs of the second strobe circuits $21S_{H2}$ and $21S_{L2}$ on the H logic side and L logic side, respectively, are applied to a HAND gate B4, and if the output $D_0$ of the IC 10 is at neither the H logic level nor the L logic level but goes into a state of high impedance (Hi-Z) at an intermediate level, it is detected to output an L level. Either one of the outputs of the HAND gate 34 and OR gate 33SR is selected by a selector 35. In the Hi-Z state detecting mode, the selector 35 selects the output of the HAND gate 34, and in the mode other than the Hi-Z state detecting mode it is controlled by a mode switching signal Z from a Hi-Z state detecting mode signal generator (not shown) to select the output of the OR gate 33S2. However, since the actual arrangement illustrated in FIG. 2 is not related to the essence of the present invention, reference will be made to the simplified drawing of FIG. 1 in the following descriptions.

As indicated above, in the prior art the comparison control signals CPE1 and CPE2 are applied to the AND gates AND1 and AND2 disposed in each of the logic comparator sections $30_1$, $30_2$, ... $30_N$ to control whether or not to output the logic comparisons. The comparison control signals CPE1 and CPE2 output from the pattern generating section 11 are applied to the the logic comparator sections $30_1$, $30_2$, ... $30_N$ in common, so that the control as to whether or not to enable the logic comparisons may be effected only in the same form with respect to all of the test channels $CH_1-CH_N$ (and hence all of the pins). In other words, the control can be carried out only as to whether to open the AND gates AND1 to take out the decision results on the exclusive-OR circuit XOR1 side only, or to open the AND gates AND2 to take out the decision results on the exclusive-OR circuit XOR2 side only, or to take out both of the results, in all the logic comparator sections $30_1$, $30_2$, ... $30_N$.

Incidentally, with the advance of the semiconductor integrated circuits, IC's requiring the various test conditions as will be mentioned below for example have been developed:

(A) As is the case with the multi-bit dynamic RAM or special memory (ASMIC: application specific memory IC), where the respective output pins may differ in their output states (logic output state or HI-Z state) in the respective test cycles, it is required to switch the comparison control signals CPE1 and CPE2 in real time for every individual pin in order to compare the output of the pin with the associated expected value signal.

(B) As in the test for the multi-bit dynamic RAM, it is required to compare only a particular cycle of a particular bit with the associated expected value signal.

(C) In a memory having a built-in logic operation circuit, it is required to control for each of the bits as to whether or not to output the comparison results with respect to the output data of the logic operation circuit.

(D) When each output bit is compared with the associated expected value signal, it is required to switch between the operation of making the comparison for each of the individual channels (that is, each of the individual pins) in real time and the operation of making the comparison for all the channels in common in real time.

With such IC's as mentioned above, there is an inconvenience that it is impossible to test them by the conventional IC tester.

With the conventional IC tester, when a plurality of IC's of the same type are to be simultaneously tested, predetermined one or more output pins of each of IC's $10_1$, $10_2$, ... $10_N$ are connected to test channels $CH_1-CH_N$ as illustrated in FIG. 3, for example, in a similar manner shown in FIG. 1. In this case, the open and closed states of gates AND1 and AND2 are controlled with respect to all the channels in common. Accordingly, there is a disadvantage that it is not possible to mask in real time only those of the IC's that have been found defective, for example.

Specifically, it is not easy to measure the AC characteristics only at a particular address of each of devices being simultaneously measured or to mask any other device or devices in real time. Although the use of a failure analysis memory would permit real time masking, all of IC testers as used in mass-production factories are not equipped with such failure analysis memories, nor do the IC testers provided with failure analysis memories have necessarily a capacity enough to accommodate all devices for simultaneous measuring thereof. In addition, in the case of a memory device there tends to be a constant relation between the dynamic current flowing through the device and the access time (response speed), so that it is necessary to use different timings for comparison in order to simultaneously measure devices having different access times. Consequently, a single test will not do, but a plurality of tests at the settings of different timings are required.

SUMMARY OF THE INVENTION

It is a first object of the invention to provide an IC tester which is capable of controlling for individual test channels independently of one another whether or not to output logic comparison results.

It is a second object of the invention to provide an IC tester which is capable of controlling comparison modes for each of individual test channels.

According to a first aspect of this invention, in an IC tester having a plurality of test channels, each including a level/timing comparator section for logically determining the level of an input signal at a desired timing, and a logic comparator section for logically comparing the result of the logic decision with an expected value signal generated by a pattern generating means to output or inhibit the logic comparison result in accordance with a comparison control signal, there are provided a pin control signal generating means for generating a pin control signal corresponding to each of the individual test channels, and a logic operation means associated with each of the individual test channels for controlling in accordance with said pin control signal whether or not to apply said comparison control signal to said logic comparator section of the corresponding test channel.

According to a second aspect of this invention, in an IC tester having a plurality of test channels, each including a level/timing comparator section for logically determining the level of an input signal at a desired timing, and a logic comparator section for logically comparing the result of the logic decision with an expected value signal produced by a pattern generating means to output or inhibit the logical comparison result in accordance with a comparison control signal, there are provided a mode switching signal generating means associated with each of the individual test channels for generating a mode switching signal, and a logical operation means associated with each of the individual test channels for altering the comparison control signal being applied to said logic comparator section of the corresponding test channel in accordance with the mode switching signal from said mode switching signal generating means.

DESCRIPTION OF THE PREFERRED EMBODIMENTS

Figure 1:
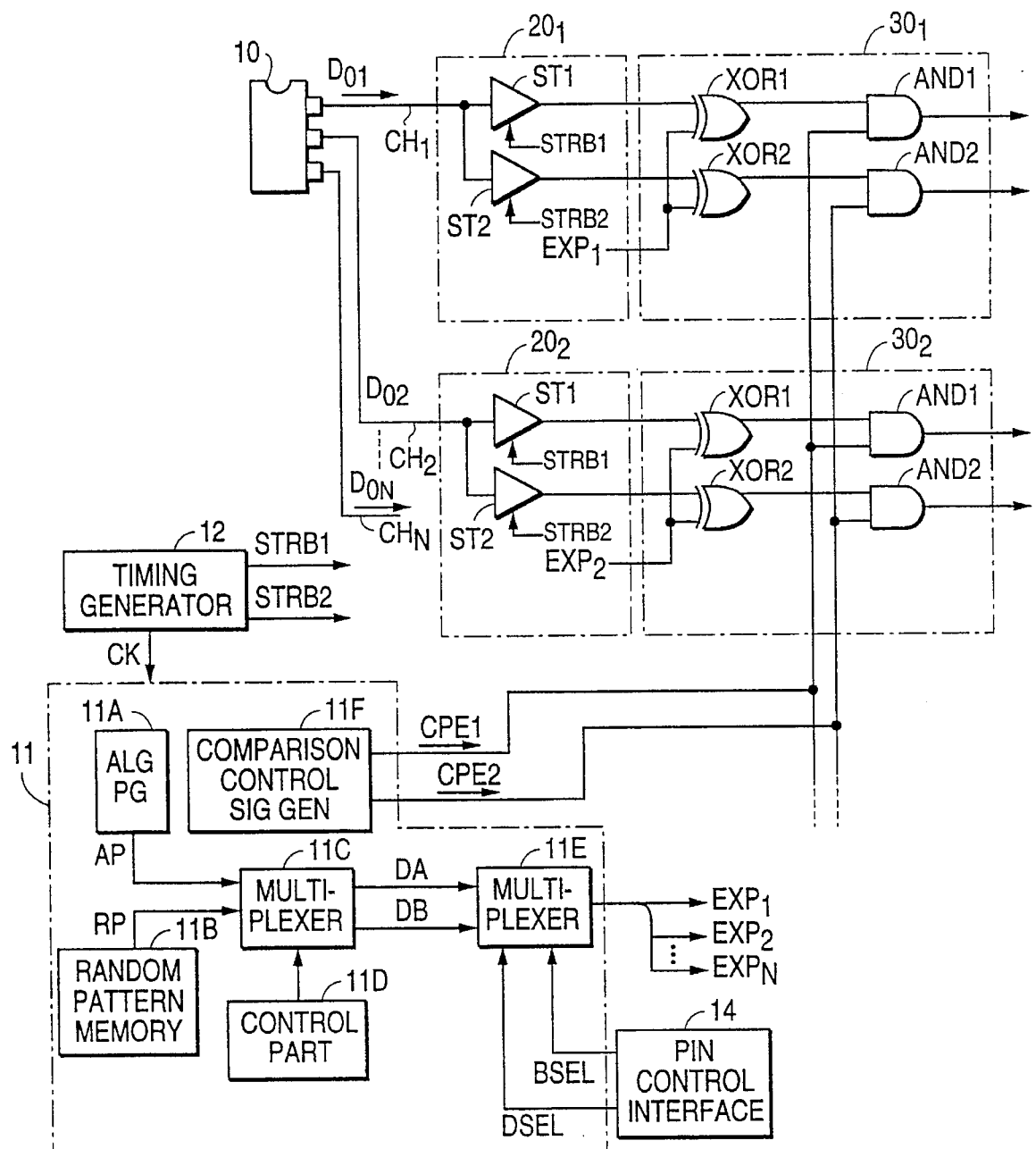
FIG. 1 is a connection diagram illustrating a prior art IC tester.
Figure 4:
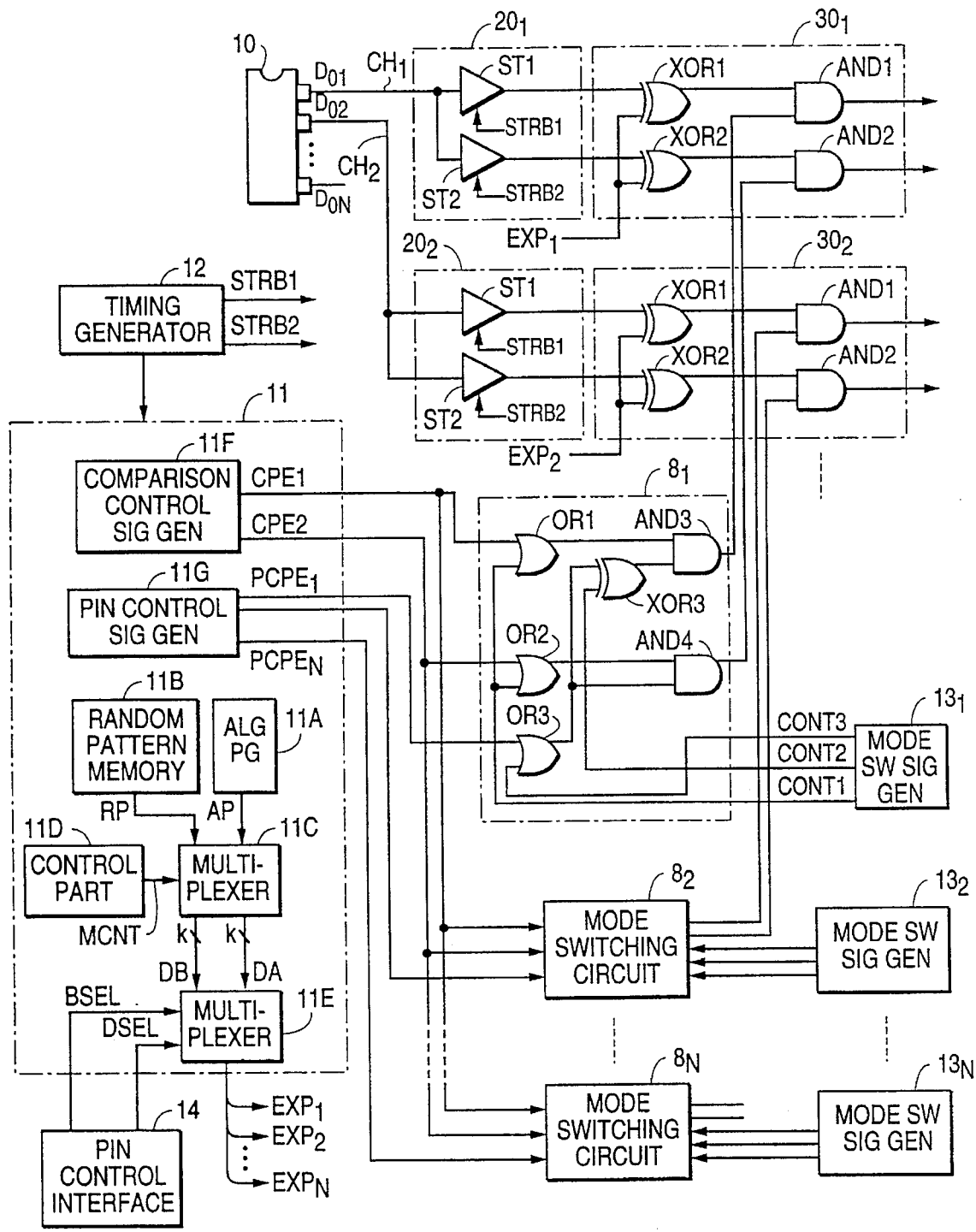
FIG. 4 is a connection diagram illustrating an embodiment of this invention.

One embodiment of this invention is shown in FIG. 4, in which the parts corresponding to those in FIG. 1 are indicated by the same reference numbers and symbols. In this invention, a pattern generating section 11 includes a pin control signal generator 11G in addition to a comparison control signal generator 11F for generating comparison control signals CPE1 and CPE2. Disposed between the pattern generating section 11 and respective logic comparator sections $30_1, 30_2, \ldots 30_N$ are mode switching circuits $8_1, 8_2, \ldots, 8_N$ for switching the comparison modes of the logic comparator sections $30_1, 30_2 \ldots 30_N$. Associated with the respective mode switching circuits $8_1, 8_2, \ldots 8_N$ are mode switching signal generators $13_1, 13_2, \ldots 13_N$ which output mode switching signals CONT1, CONT2, CONT3 to control the mode switching.

In this embodiment each of the mode switching circuits $8_1, 8_2, \ldots 8_N$ is illustrated as comprising three OR gates OR1, OR2 and OR3, two AND gates AND3 and AND5, and one exclusive-OR circuit XOR3. One of the input terminals of each of the OR gates OR1 and OR2 is connected in common to receive a mode switching signal CONT1 from the mode switching signal generator $13_1$, for example. The other of the input terminals of the OR gate OR1 is supplied with a comparison control signal CPE1, and the other of the input terminals of the OR gate OR2 is supplied with a comparison control signal CPE2. The comparison control signals CPE1 and CPE2 can thus be altered to, one of the logics "1", by making the mode switching signal CONT1 "1". One of the input terminals of the OR gate OR3 is provided with a mode switching signal CONT3 from the mode switching signal generator $13_1$ while the other of the input terminals of the OR gate OR3 is supplied with corresponding one of pin control signals $PCPE_1, PCPE_2, \ldots PCPE_N$. The pin control signal PCPE may be fixed to, one of the logics "1" by making the mode switching signal CONTS "1".

The output terminals of the OR gates OR1 and OR2 are connected to one of the input terminals of the AND gates ANDS and AND4, respectively. The output terminal of the OR gate OR3 is connected to one of the input terminals of the exclusive-OR circuit XOR3 as well as to the other of the input terminals of the AND gate AND3. The other of the input terminals of the exclusive-OR circuit XOR3 is provided with a mode switching signal CONT2 while the output terminal of the exclusive-OR circuit XOR3 is connected with the other of the input terminals of the AND gate AND3. It is thus possible to control in accordance with the pin control signals PCPE whether or not to output the comparison control signals CPE1 and CPE2 from the AND gates AND3 and AND4. It is also possible to invert the logic of the pin control signal PCPE applied to the AND gate AND3 by making the mode switching signal CONT4 "1". The output terminal of the AND gate AND4 is connected with one of the input terminals of the AND gates AND1 and AND2, respectively disposed in the associated one of the logic comparator sections $30_1, 30_2 \ldots 30_N$ to control the opening and closing of the AND gates AND1 and AND2 to thereby control whether or not to output the logic comparison results.

Figure 5:
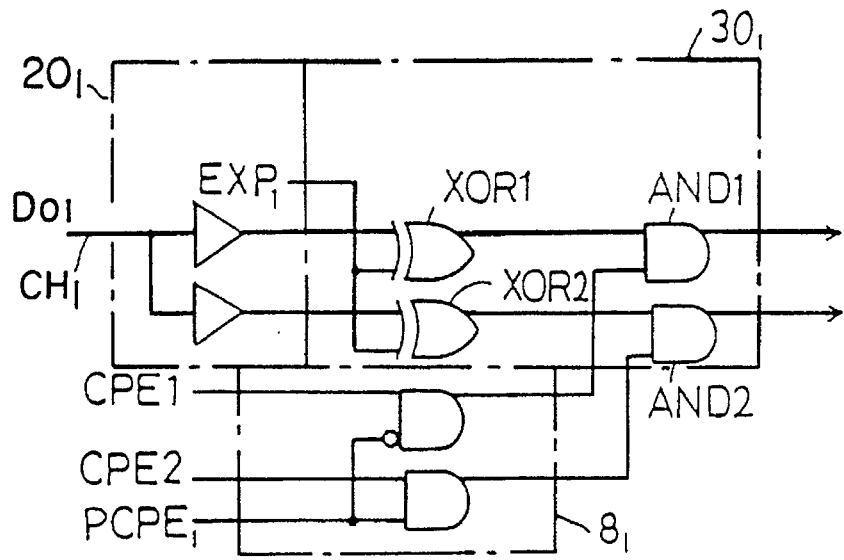
FIG. 5 is a simplified equivalent circuit diagram illustrating the IC tester according to this invention being in one (multiplex mode) of switchable modes of operation.

With the arrangement of the mode switching circuits $8_1, 8_2, \ldots 8_N$ as described above, when the mode switching signal CONT1 is set to a logic "1" and the others are set to a logic "0", the mode switching circuits $8_1, 8_2, \ldots 8_N$ may be representatively expressed as a simplified equivalent circuit $8_1$ as shown in FIG. 5. According to the equivalent circuit shown in FIG. 5, it is possible to switch between the comparison control signals CPE1 and CPE2 in real time according to the logic of the pin control signal $PCPE_1$ so as to output either one of the comparison control signals CPE1 and CPE2. This state of setting will hereinafter be referred to as "multiplex mode".

Figure 2:
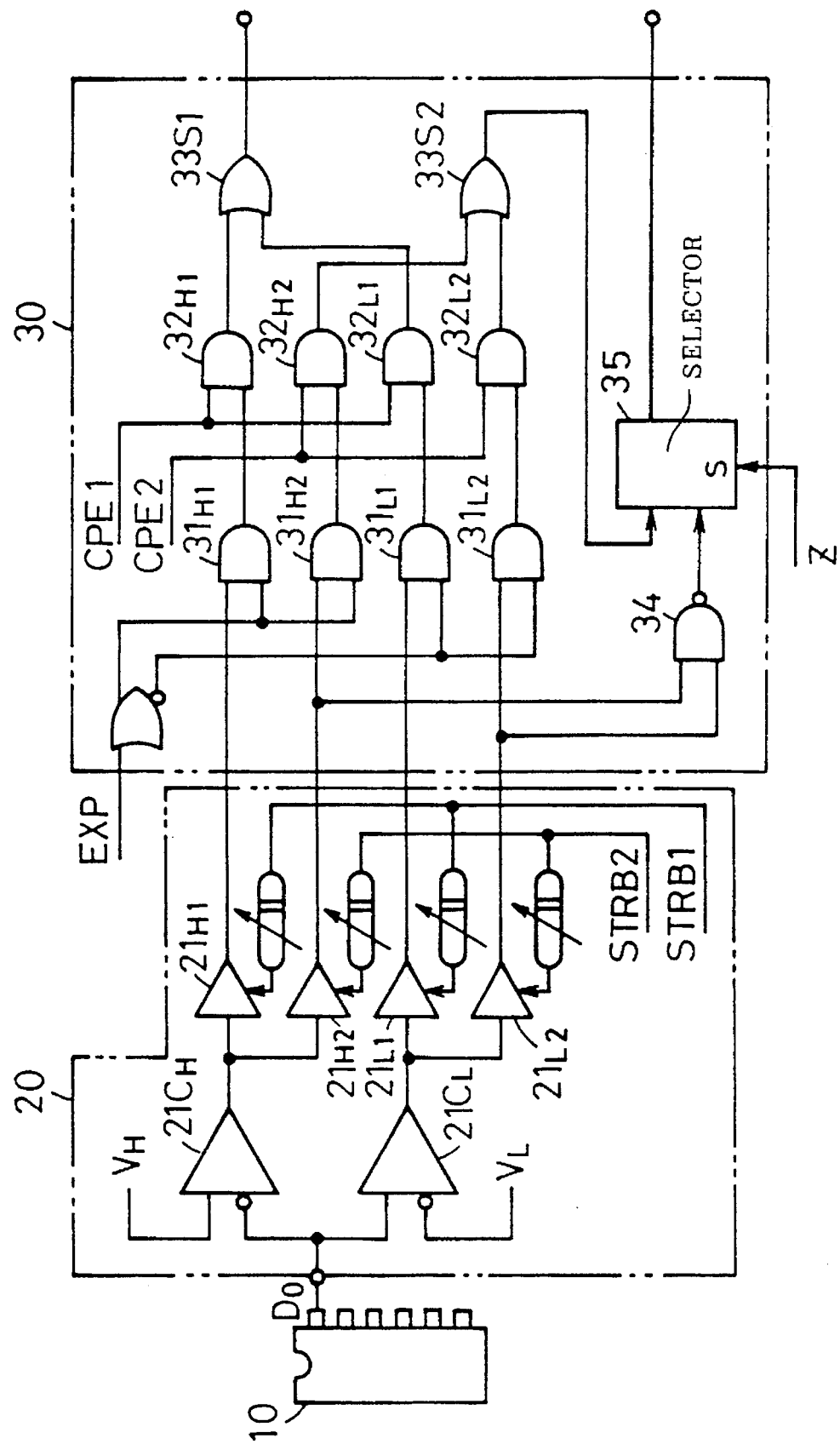
FIG. 2 is a connection diagram illustrating an actual construction of the level/timing comparator section and logic comparator section shown in FIG. 1.

In the embodiment of FIG. 4 as well, the level/timing comparator section 20 and logic comparator section 30 of each of the test channels $CH_1$–$CH_N$ are constructed in a similar manner shown in FIG. 2, and level comparators $21C_H$ and $21C_L$ for determining the H logic and L logic are disposed in the front stage of the strobe circuits $21S_{H1}$, $21S_{H2}$, $21S_{L1}$, $21S_{L2}$. The logic decision is made in the form of either the H logic comparison or the L logic comparison by using the results obtained by extracting the analog comparison results at the timings of the strobe signals STRB1 and STRB2 in the strobe circuits and the expected value pattern EXP. When it is desired to detect a high impedance state Hi-Z the selector 35 is controlled by the mode switching signal Z to select the output of the NAND gate 34, and an intermediate level between the H logic level and the L logic level is detected by two level comparators $21C_H$ and $21C_L$ and the detected result is extracted by the strobe STRB2 in the strobe circuits $21S_{H2}$, $21S_{L2}$ to be obtained as an output of the NAND gate 34.

Figure 6:
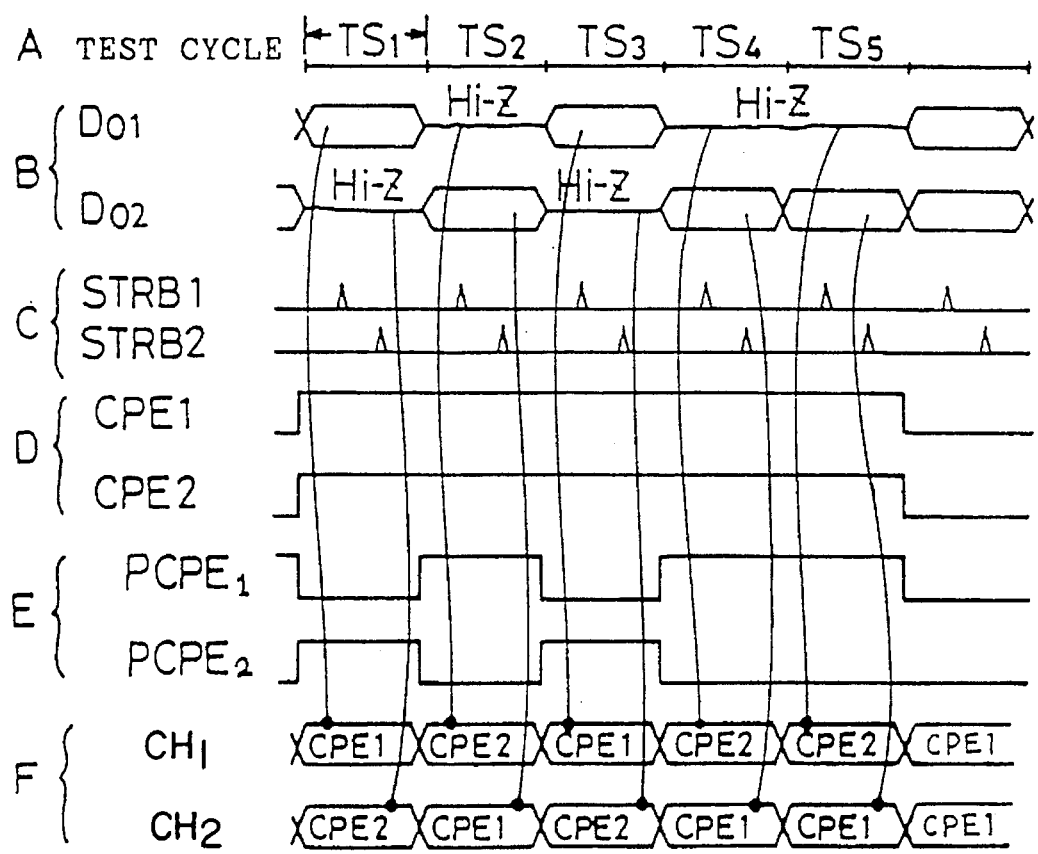
FIG. 6 is a waveform diagram for illustrating the operation of FIG. 5.

According to this multiplex mode, in the case where an IC 10 under test outputs a high impedance state Hi-Z in a different test cycle $TS_1, TS_2, \ldots TS_N$ (Row A) for each of the individual pins, it is possible to compare and determine the results obtained by extracting the high impedance state on the strobe STRB2 side for the individual pins, that is, for the individual channels, as illustrated in Rows B and C in FIG. 6. Accordingly, in the case where the outputs $D_{01}$ and $D_{02}$ of the first and second pins respectively output the high impedance state in different test cycles as shown in FIG. 6, Row B, the comparison control signals CPE1 and CPE2 must be controlled independently for the individual pins with respect to the results obtained by logically comparing with the expected value EXP by the strobes STRB1 and STRB2. Inorder to render effective the result obtained by logically comparing with the expected value EXP on the strobe STRB1, it is only required to control the gate AND1 to open it by selecting the comparison control signal CPE1. In order to render effective the result obtained by logically comparing with the expected value EXP on the strobe STRB2, it is only required to control the gate AND2 to open it by selecting the comparison control signal CPE2.

According to the multiplex mode shown in FIG. 5, the comparison control signals CPE1 and CPE2 are set to "1" as shown in FIG. 6, Row D, while the $PCPE_1$ and $PCPE_2$ are set to "0" and "1", respectively, in the first test cycle $TS_1$ as shown in Row E in FIG. 6 by generating pin control signals $PCPE_1$ and $PCPE_2$ for the first and second pins (channels CH1 and CH2), respectively. Since the comparison control signal CPE1 is selected to control the opening and closing of the gate AND1 in the logic comparator section $30_1$ for the first pin, the first pin renders effective the result obtained by logic comparison on the strobe STRB1. At this time the pin control signal $PCPE_2$ on the second pin side has been set to "1", so that the gate AND2 is controlled to be open in the logic comparator section $30_2$ for the second pin to thereby render effective the result obtained by logic comparison on the strobe STRB2. Row F in FIG. 6 shows the comparison control signals CPE1 and CPE2 selected for the first and second pin sides (channels CH1 and CH2), respectively, in each test cycle $TS_1, TS_2, \ldots TS_N$.

According to the multiplex mode, as shown in FIG. 6, Row F different comparison control signals CPE1 and CPE2 may be arbitrarily selected for every individual pin in the same test cycle to be applied to the gates AND1 and AND2 whereby the opening and closing of the gates AND1 and AND2 may be controlled independently of the conditions of control for the other pins. As a result, it is possible to test even such IC's in which high impedance output states occur in different test cycles for every individual pin as illustrated in Row B in FIG. 6 and such IC's in which outputs desired to be logically compared are produced at different timings for every individual pin.

Figure 7:
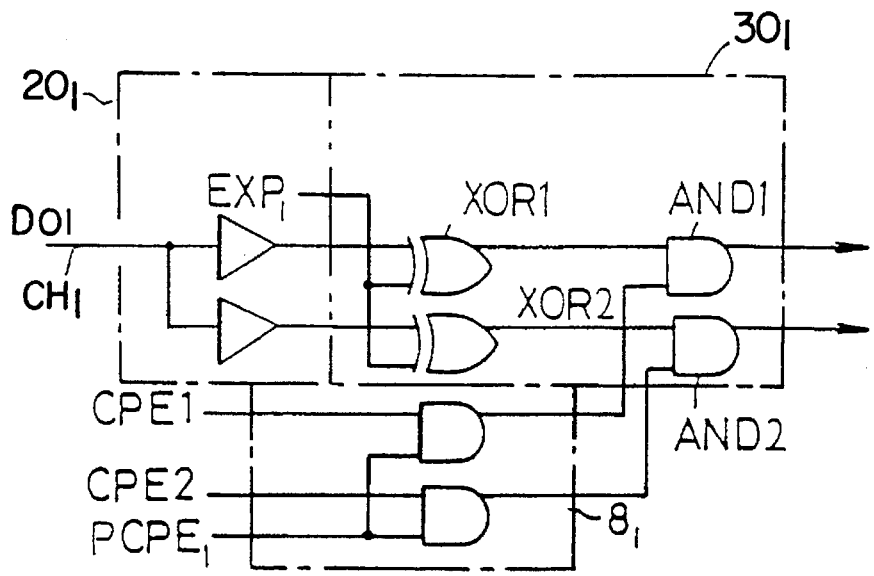
FIG. 7 is a simplified equivalent circuit diagram illustrating another one (masking mode) of the switchable modes of operation of this invention.

When all the mode switching signals CONT1–CONT3 are set to a logic "0", the mode switching circuits $8_1$–$8_N$ shown in FIG. 4 may be representatively expressed as a simplified equivalent circuit $8_1$ as shown in FIG. 7. This state of setting will be referred to as "AND mode" or "masking mode". According to this masking mode, it is possible to logically compare the output of only selected one or more of all the pins of an IC under test while masking the comparison results of the other pin or pins.

Figure 8:
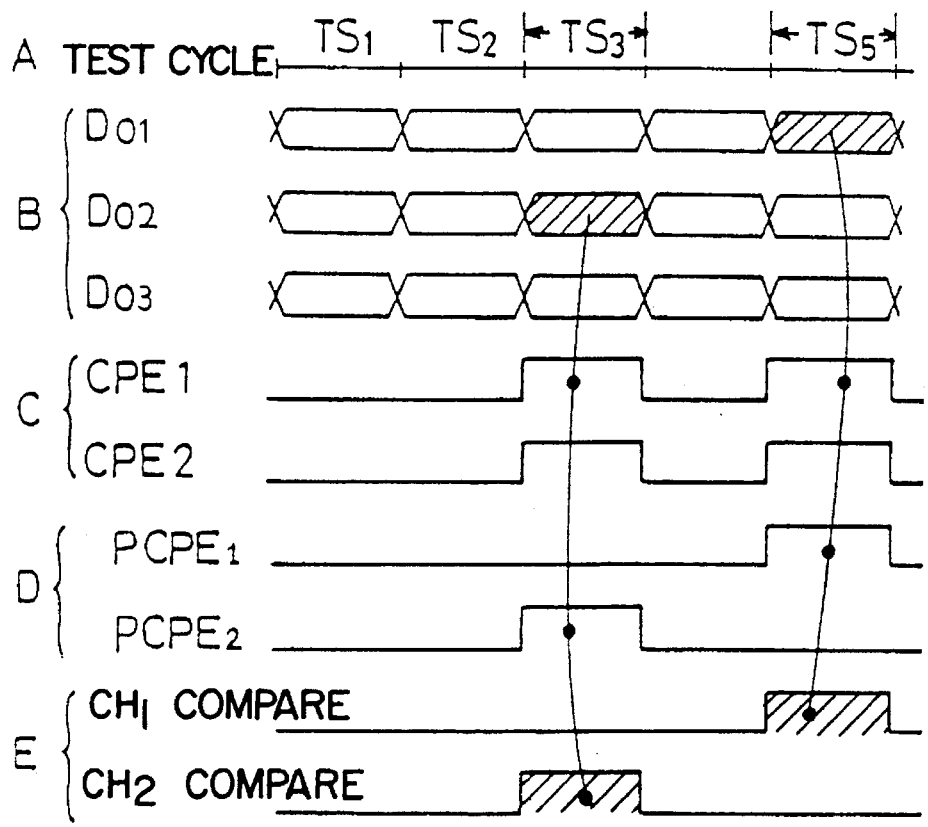
FIG. 8 is a waveform diagram for illustrating the operation of FIG. 7.

More specifically, this embodiment represents an example in which the setting is such that logic comparison is conducted on the output signal of a predetermined one of the pins of an IC 10 under test, say the output signal $D_{02}$ of the second pin in the third test cycle $TS_3$ (the hatched portion in FIG. 8) only, as illustrated in FIG. 8. To this end it is only required to invert the comparison control signal CPE1 or CPE2 (Row C) and the pin control signal $PCPE_2$ (Row D) to "1" in the test cycle $TS_3$ in which it is desired to make logic comparison. FIG. 8 illustrates an example in which in the test cycle $TS_3$ the comparison control signals CPE1, CPE2 and the pin control signal $PCPE_2$ are inverted to "1" so as to effect logic comparison on only the output $D_{02}$ of the second pin while in the test cycle TSs the comparison control signals CPE1, CPE2 and the pin control signal $PCPE_2$ are inverted to "1" so as to effect logic comparison on only the output $D_{01}$ of the first pin.

As indicated above, according to the masking mode, it is possible to select the output signal only of any desired one or more of the pins of an IC 10 under test for logic comparison. A particular test cycle of s particular pin may thus be specified for comparison, which is effective for a failure analysis test of a memory.

Figure 9:
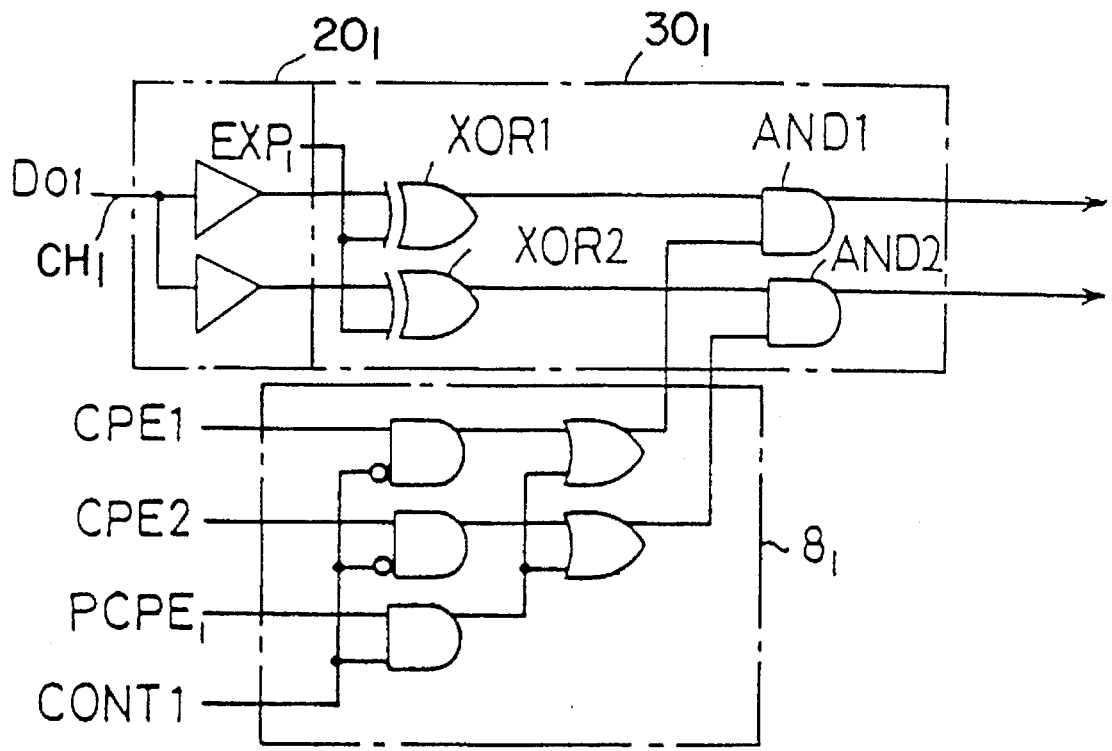
FIG. 9 is a simplified equivalent circuit diagram illustrating yet another one (individual pin control mode) of the switchable modes of operation of this invention.

When the mode switching signal CONT1 is set to "1" and the mode switching signals CONT2 and CONT3 to "0", the mode switching circuits $8_1$–$8_N$ may be representatively expressed as a simplified equivalent circuit $8_1$ as shown in FIG. 9 in which the comparison control signals CPE1 and CPE2 are inhibited and the pin control signal $PCPE_1$ is applied to both of the gates AND1 and AND2. This operation mode of the equivalent circuit will be referred to as "individual pin control mode" (pin-by-pin control mode).

According to this individual pin control mode, it is possible to control for every individual pin whether or not to effect logic comparison by using a pin control signal $PCPE_1$–$PCPE_N$ independent of each other for the individual pins. On each pin, the AND gates AND1 and AND2 are simultaneously controlled to be opened or closed to output both of the results of logic comparisons effected on the strobes STRB1 and STRB2.

Figure 10:
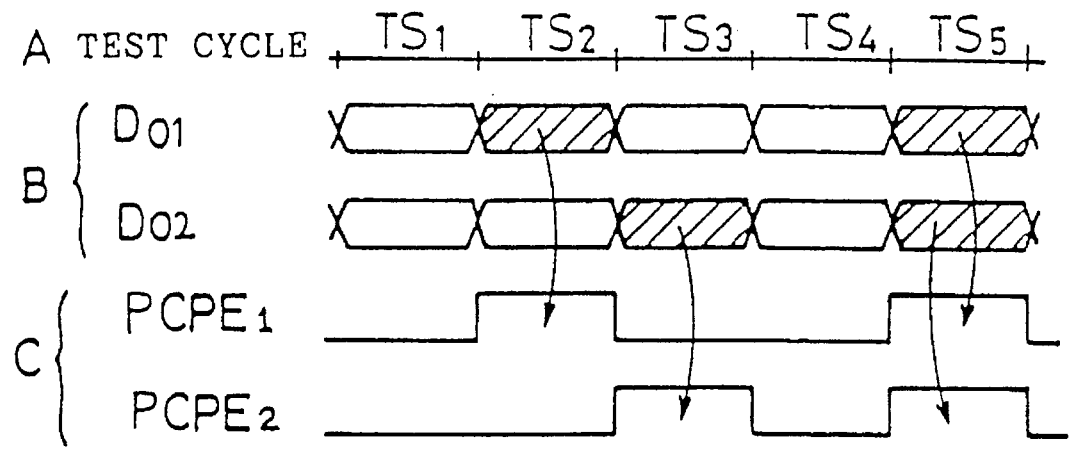
FIG. 10 is a waveform diagram for illustrating the operation of FIG. 9.

The operation of the individual pin control mode as shown in FIG. 9 will now be described with reference to FIG. 10. The example shown in FIG. 10 represents a case in which in the test cycles $TS_2$ and $TS_5$ the pin control signal $PCPE_1$ is inverted to "1" to effect logic comparison on the first pin while in the test cycles $TS_3$ and $TS_5$ the pin control signal $PCPE_2$ is inverted to "1" to effect logic comparison on the output $D_{O2}$ of the second pin. In this way, it is possible to specify a desired pin solely for every individual test cycle to conduct logic comparison thereon by inverting any one of the pin control signals $PCPE_1-PCPE_N$ in a desired test cycle. This individual pin control mode is suitable for testing the logic output data of an IC such as an IC having a built-in logic circuit capable of outputting an independent pattern signal for every individual pin.

Figure 11:
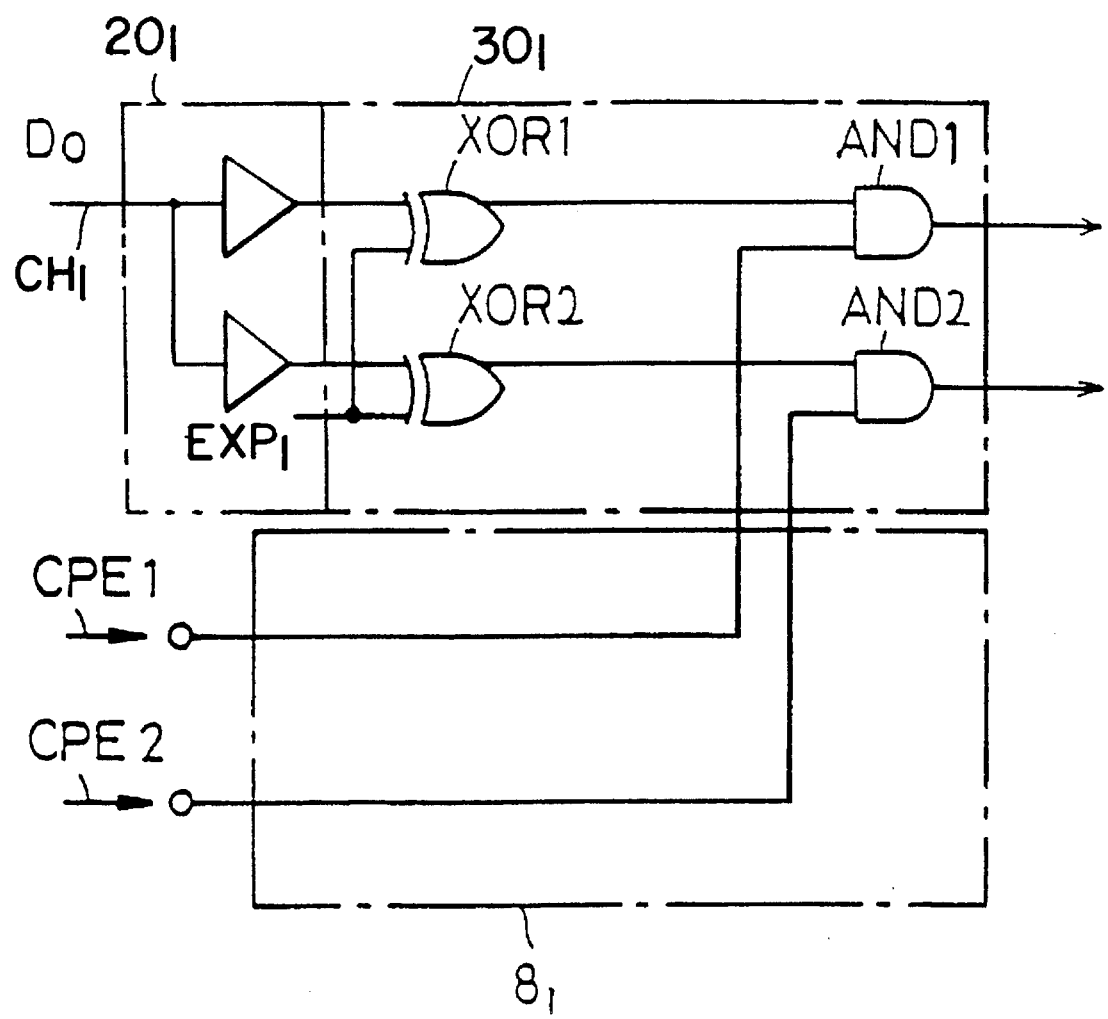
FIG. 11 is a simplified equivalent circuit diagram illustrating yet another one (conventional mode) of the switchable modes of operation of this invention.

When the mode switching signals CONT1 and CONT2 are set to "0" and the mode switching signal CONT3 is set to "1", the mode switching circuits $8_1-8_N$ will operate as an equivalent circuit $8_1$ representatively shown in FIG. 11. According to the equivalent circuit $8_1$ shown in FIG. 11, the comparison control signals CPE1 and CPE2 are applied to all the associated gates AND1 and AND2 in common. In this mode the operation is the same as in the prior art illustrated in FIG. 1. This mode will be, therefore, referred to as "conventional mode".

Figure 12:
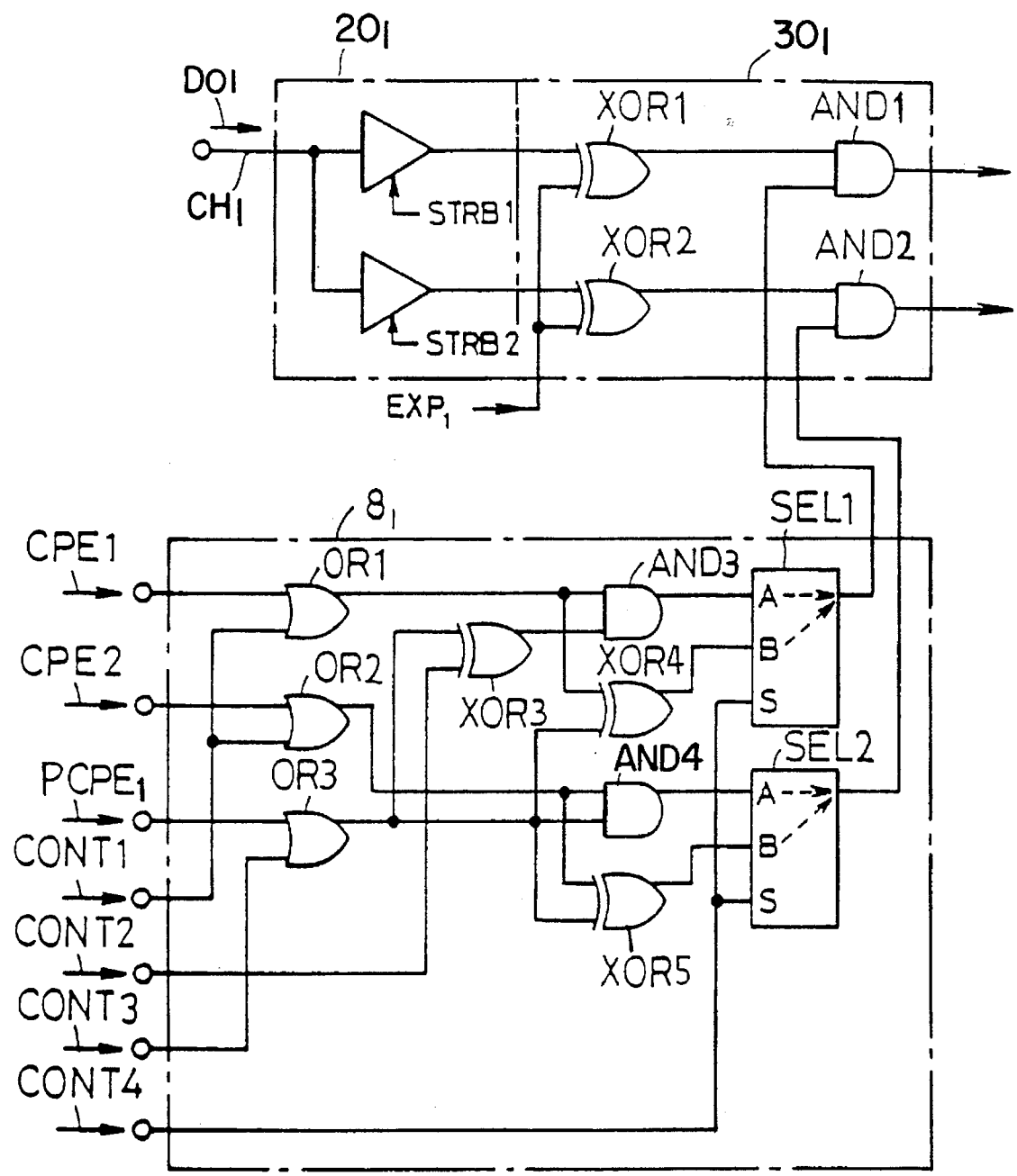
FIG. 12 is a connection diagram illustrating a modified embodiment of this invention.
Figure 13:
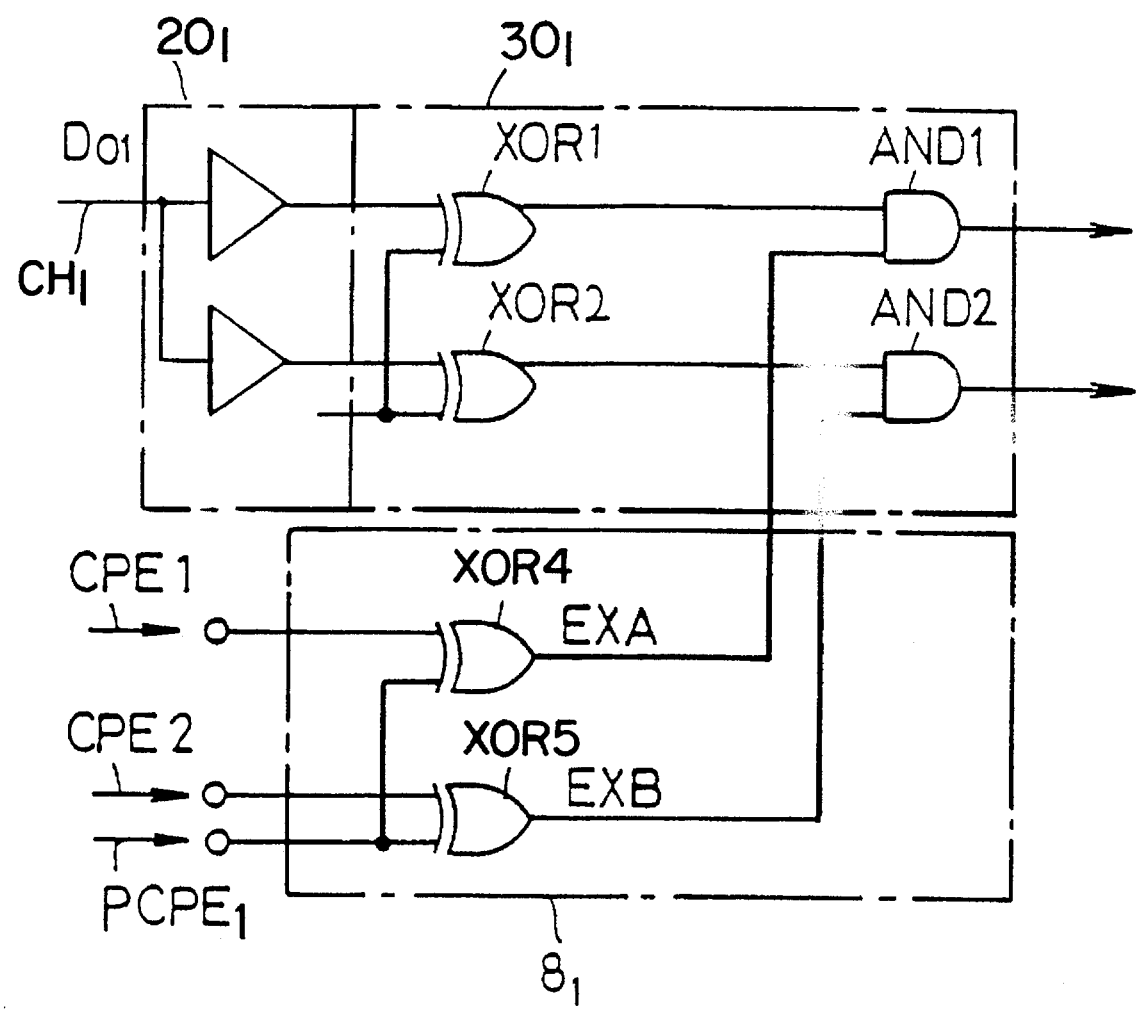
FIG. 13 is a simplified equivalent circuit diagram illustrating the embodiment of FIG. 12 being in the exclusive-OR mode.

FIG. 12 illustrates a modified embodiment of the mode switching circuits $8_1-8_N$ shown in FIG. 4 representatively by a mode switching circuits $8_1$. In this embodiment, each of the mode switching circuits $8_1-8_N$ further comprises two exclusive-OR circuits XOR4 and XOR5 and two selectors SEL1 and SEL2, in addition to three OR gates OR1, OR2 and OR3, and one exclusive-OR circuit XOR3. The states of these selectors SEL1 and SEL2 are controlled by the mode switching signals CONT4 generated in the respective mode switching signal generators $13_1-13_N$. When a mode switching signal CONT4 corresponding to any one of the channels is set to "1", the other mode switching signals CONT1-CONT3 corresponding to said one channel are set to "0". When the mode switching signal CONT4 is set to "1", the selectors SEL1 and SEL2 of the mode switching circuit corresponding to said one channel will select the signals input into the input terminal B and output the selected one. Accordingly, in the embodiment illustrated in FIG. 12, when the mode switching signal CONT4 is set to "1", the mode switching circuits 8, will operate as an equivalent circuit $8_1$ shown in FIG. 13. This mode will be referred to as "exclusive-OR mode".

According to this exclusive-OR mode, the AND gates AND1 and AND2 disposed in the respective logic comparator sections $30_1, 30_2, \ldots 30_N$ are controlled by taking an exclusive-OR of the comparison control signals CPE1, CPE2 and the pin control signals $PCPE_1, PCPE_2, \ldots PCPE_N$ independent of each other for the individual pins. Specifically, when the pin control signals $PCPE_1, PCPE_2, \ldots PCPE_N$ are set to "0", the comparison control signals CPE1 and CPE2 become effective to thereby control the AND gates AND1 and AND2 of all the logic comparator sections $30_1-30_N$ between their open and closed states. In addition, when the pin control signals $PCPE_1, PCPE_2, \ldots PCPE_{N1}$ are set to "0", the pin control signals $PCPE_1, PCPE_2, \ldots PCPE_{N1}$ become effective to thereby control the opening and closing of the AND gates AND1 and AND2 of the logic comparator sections $30_1-30_N$ to which said pin control signals are applied.

Figures 14, 15:
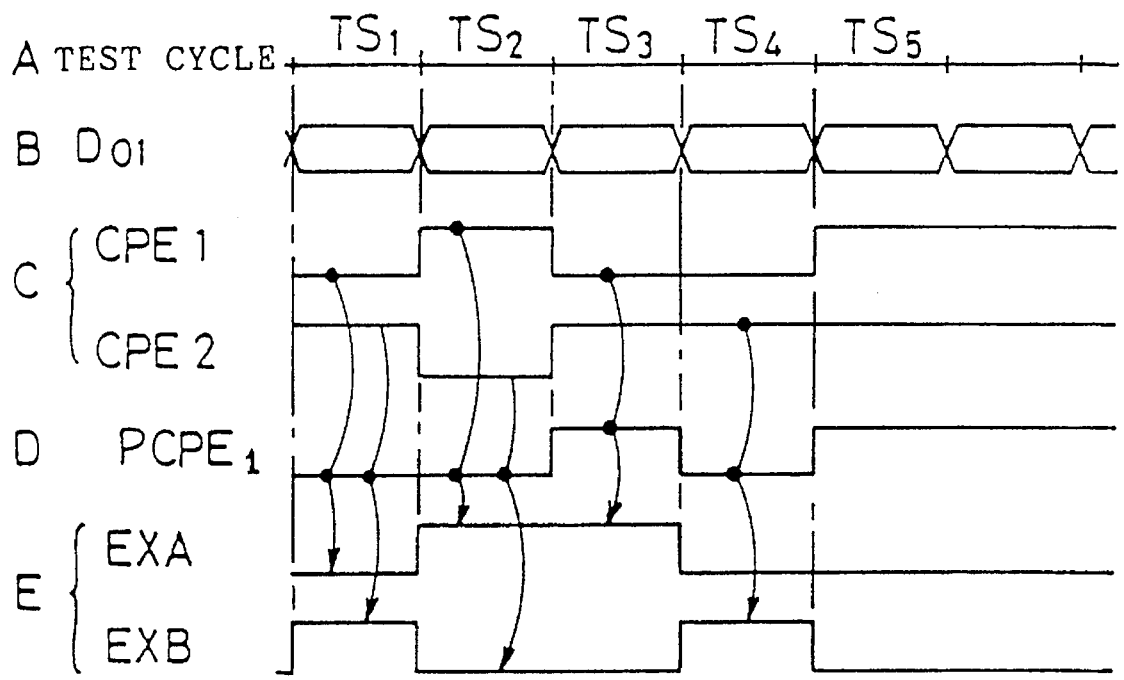
FIG. 14 is a waveform diagram for illustrating the operation of the mode depicted in FIG. 13.
FIG. 15 is a diagram for illustrating the logic of mode setting signals and the switched mode states.

FIG. 14 shows a timing chart for illustrating the operation of the exclusive-OR mode. The output EXA of the exclusive-OR circuit XOR4 in the mode switching circuits $8_1-8_N$ is obtained by taking an exclusive-OR of the comparison control signal CPE1 and the pin control signal $PCPE_1$ as shown in Rows C, D and E in FIG. 14. Likewise, the output EXB of the exclusive-OR circuit XOR5 is obtained by taking an exclusive-OR of the comparison control signal CPE2 and the pin control signal $PCPE_1$ as shown in Rows C, D and E in FIG. 14.

In the embodiment illustrated in FIG. 12, when the mode switching signal CONT4 is set to "0", both of the selectors SEL1 and SEL2 select the terminal A side for outputting, so that the arrangement becomes similar to that of the embodiment shown in FIG. 4. Consequently, it is possible to select the multiplex mode, masking mode, individual pin control mode and conventional mode described above. The relationship between these various modes and the set logic values of the mode switching signals $CONT1-CONT_4$ is collectively shown in the table of FIG. 15.

While in the foregoing discussion this invention has been described with reference to the embodiments where it is used to conduct a test on an IC having a plurality of pins in such a manner that test channels are connected to those pins, it is to be appreciated that this invention is also applicable to simultaneously testing a plurality of IC's of the same type. An embodiment useful for such application is illustrated in FIG. 16.

Figure 16:
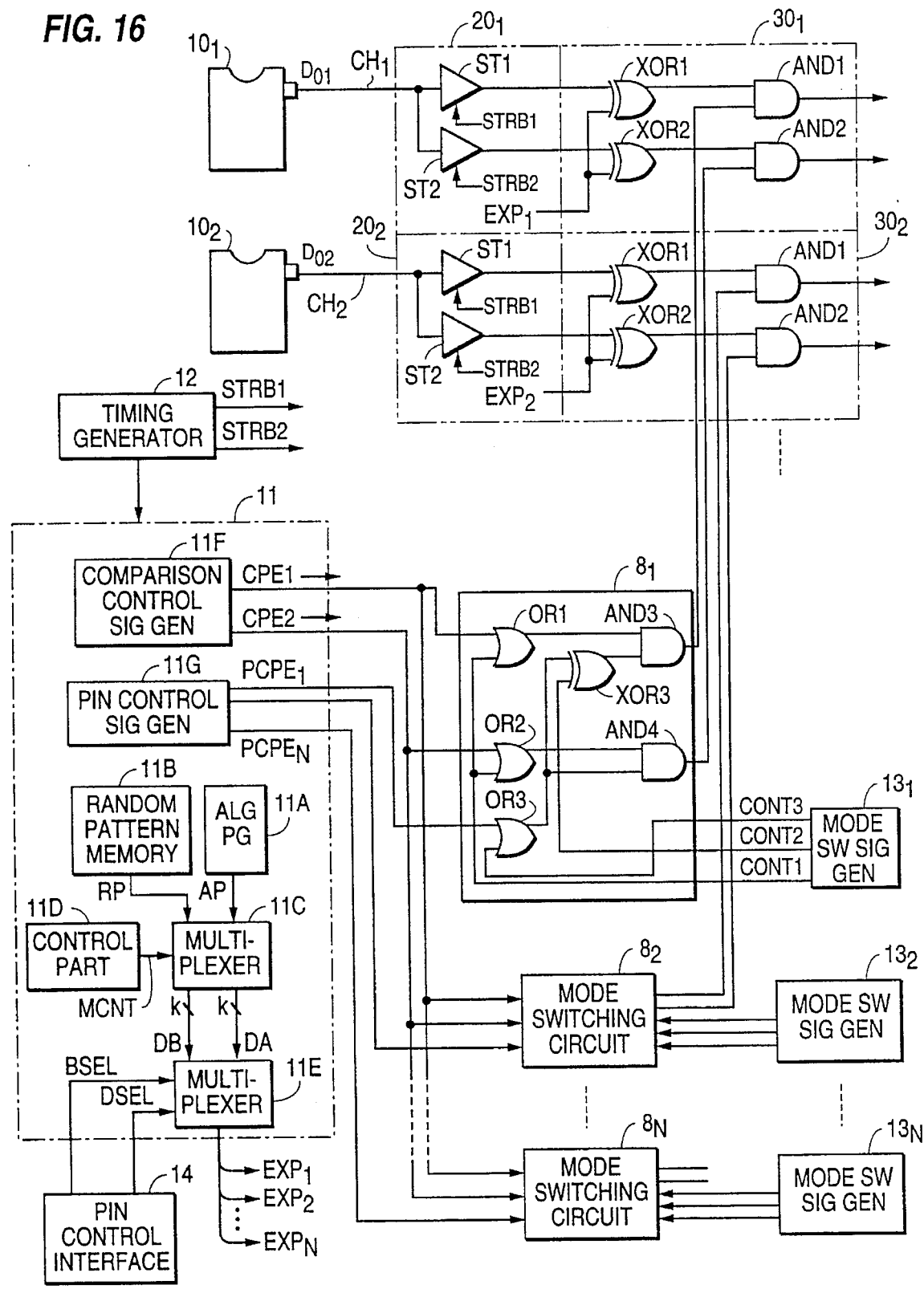
FIG. 16 is a connection diagram illustrating another embodiment of this invention.

In FIG. 16, the parts corresponding to those in FIG. 4 are indicated by the same reference numbers and symbols. In this embodiment, the construction per se of the IC tester is identical to that shown in FIG. 4 except that corresponding one or more (one in this embodiment) of output pins each of a plurality of IC's of the same type to be tested is or are connected to respective test channels $CH_1-CH_N$. Specifically, as in the embodiment of FIG. 4, disposed between the AND gates AND1, AND2 in the respective logic comparator sections $30_1, 30_2, \ldots 30_N$ and the comparison control signal generator 11C are mode switching circuits $8_1, 8_2, \ldots 8_N$ identical to those shown in FIG. 4, and mode switching signal generators $13_1, 13_2, \ldots 13_N$ for outputting mode switching signals CONT1, CONT2, CONT3 to control the mode switching circuits $8_1, 8_2, \ldots 8_N$. In addition, in the pattern generating section 11 there is provided a pin control signal generator 11G for generating pin control signals $PCPE_1, PCPE_2, \ldots PCPE_N$ for the associated test channels $CH_1-CH_N$. The actual construction of the level/timing comparator section 20 and the logic comparator section 30 for each of the test channels is the same as shown in FIG. 2.

The pin control signal generator 11G produces as many pin control signals $PCPE_1, PCPE_2, \ldots PCPE_N$ as the test channels $CH_1-CH_N$. When any one of the pin control signals $PCPE_1-PCPE_N$ is "0", the logic comparison operation on the corresponding one of the test channels $CH_1-CH_N$ (IC's 10, $10_1-10_N$ being tested) will be masked.

Connected to the mode switching circuits $8_1-8_N$ are mode switching signal generators $13_1-13_N$ each of which outputs mode switching signals CONT1-CONT3, whereby the state of the mode switching circuits $8_1-8_N$ is controlled depending on the logic states of the mode switching signals CONT1-CONT3 as illustrated in the table of FIG. 15. In this embodiment, however, there is no exclusive-OR mode since the mode switching signal CONT4 is not employed. But if the mode switching circuits $8_1-8_N$ are arranged as shown in FIG. 12, the exclusive-OR mode may be selected by generating a mode switching signal CONT4.

Figure 17:
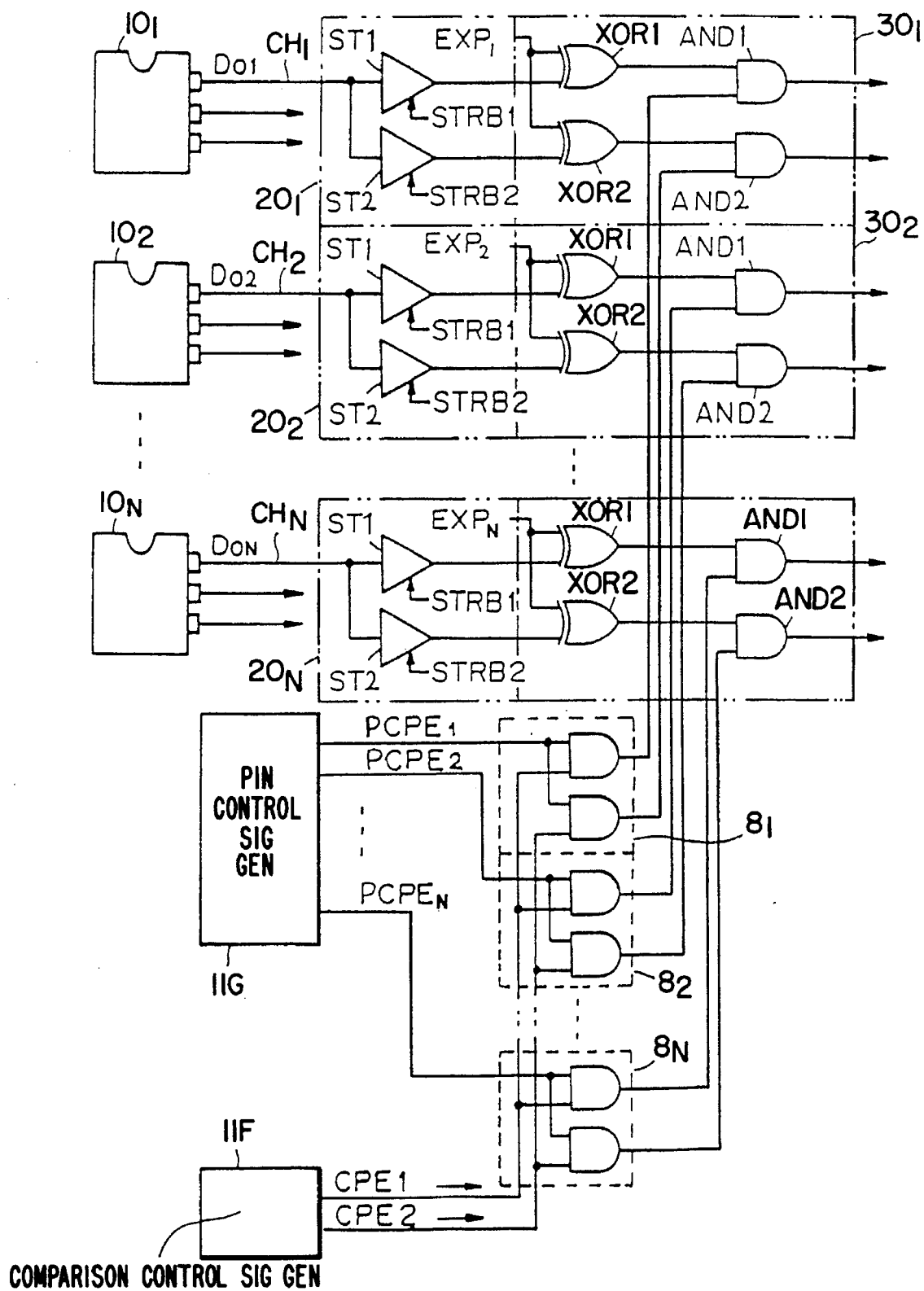
FIG. 17 is a connection diagram illustrating the embodiment of FIG. 16 being set in the masking mode.

When all of the logic values of the mode switching signals CONT1-CONT3 applied to any one or more of the test channels are set to "0", the mode switching circuits $8_1-8_N$ corresponding to said one or more test channels are all switched to the masking mode. FIG. 17 shows an equivalent circuit where the mode switching signals CONT1-CONT3 of all the test channels $CH_1-CH_N$ are all set to "0". For the benefit of simplification of the drawing, however, the algorithmic pattern generator 11A, the random pattern memory 11B, multiplexers 11C, 11D, the control part 11D, etc. in the pattern generating section 11 are omitted from this drawing. As shown in FIG. 17, each of the mode switching circuits $8_1$–$8_N$ is equivalently constructed of only two AND gates as in the case of FIG. 7. The two AND gates are controlled to be opened when the respective pin control signals $PCPE_1$–$PCPE_N$ are "1". In this state the comparison control signals CPE1 and CPE2 are applied to the AND gates AND1, AND2 in the respective logic comparator sections $30_1$–$30_N$.

When the pin control signals $PCPE_1$–$PCPE_N$ are set to "0", the mode switching circuits $8_1$–$8_N$ are controlled to be closed, whereupon the comparison control signals CPE1 and CPE2 are not applied to the logic comparator sections $30_1$–$30_N$. That is, the AND gates AND1, AND2 in the logic comparator sections $30_1$–$30_N$ are controlled to be closed, so that the logic comparison results are masked without being output. Consequently, if any desired one or more of the pin control signals $PCPE_1$–$PCPE_N$ is or are set to "0" in real time, the logic comparison results on the one or more of the IC's under test corresponding to the one or more of the logic comparator sections $30_1$–$30_N$ which is or are set to "0" are masked during the "0" set time. The logic comparison operations on any one or more of the IC's under test may thus be masked. The timings of masking may also be arbitrarily set. In order to change the masking order or the like in real time, the pin control signal generator 11G may be constructed of a register, for example, in which the masking order, etc. may be prestored. From such a register masking data may be read out to generate pin control signals $PCPE_1$–$PCPE_N$.

Figure 18:
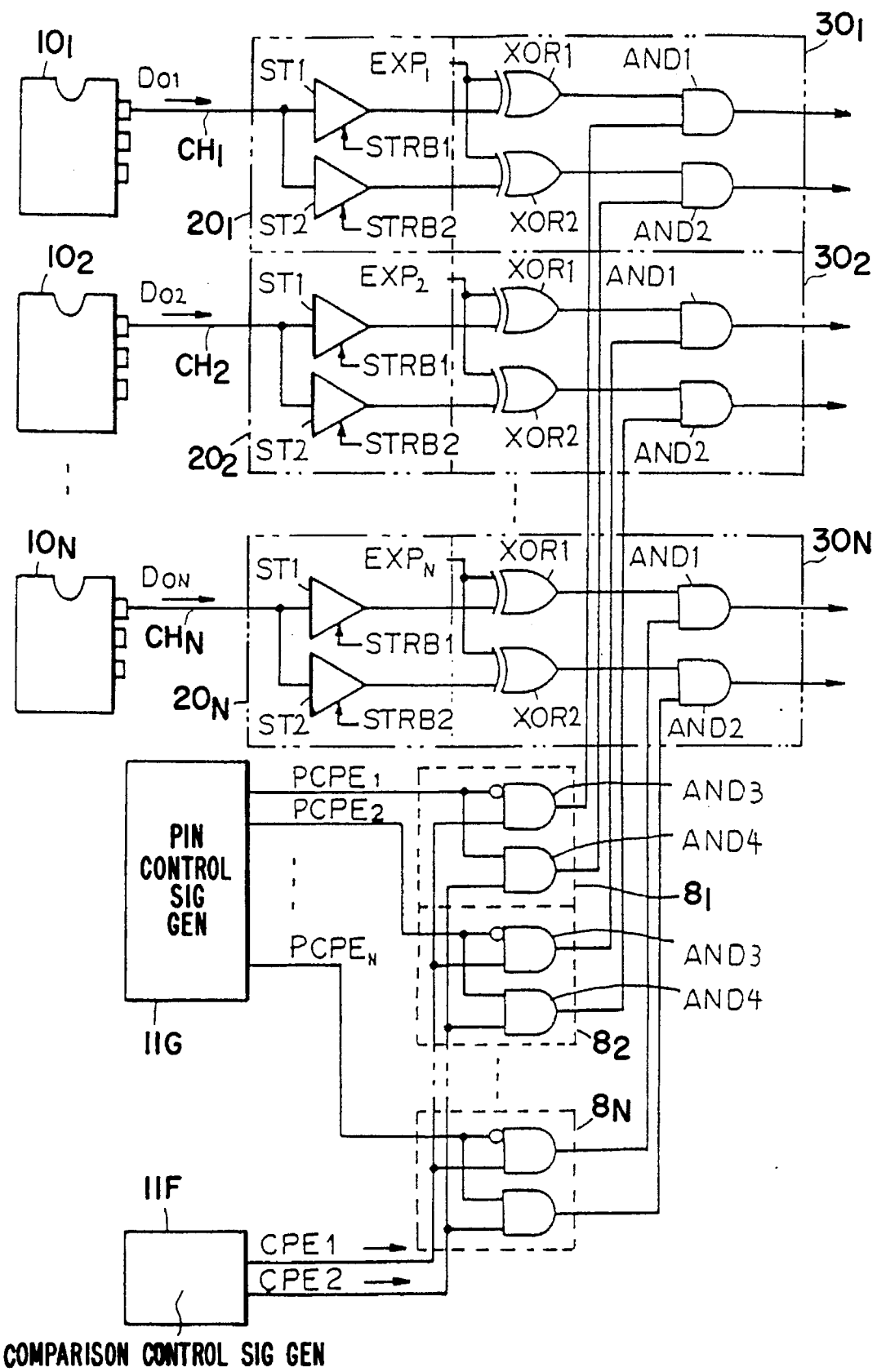
FIG. 18 is a connection diagram illustrating the embodiment of FIG. 16 being set in the multiplex mode.

When the mode switching signals CONT1, CONT2 and CONT3 of any one of the test channels are set to "0", "1" and "0", respectively, an equivalent circuit of the mode switching circuit 8 associated with said test channel will be the same as shown in FIG. 5 and be in the multiplex mode. Accordingly, if all the test channels $CH_1$–$CH_N$ are set to the multiplex mode, the equivalent circuit will be as shown in FIG. 18. In this case, when the pin control signals $PCPE_1$–$PCPE_N$ are "0", the gate AND3 is opened, and the comparison control signal CPE1 passes through the gate AND3 to be supplied to the gate AND1 disposed in the logic comparator sections $30_1$, $30_2$, ... $30_N$. Thus, the gate AND1 is controlled to be opened to output the logic comparison results on the strobe STRB1 side only when the comparison control signal CPE1 is "0".

When the pin control signals $PCPE_1$–$PCPE_N$ are "1", the gate AND4 is controlled to be opened. Then, the comparison control signal CPE2 passes through the gate AND4 to be supplied to the gate AND2 disposed in the logic comparator sections $30_1$, $30_2$, ... $30_N$. Thus, the gate AND2 is controlled to be opened to output the logic comparison results on the strobe STRB2 side when the comparison control signal CPE1 is "1".

Figure 19:
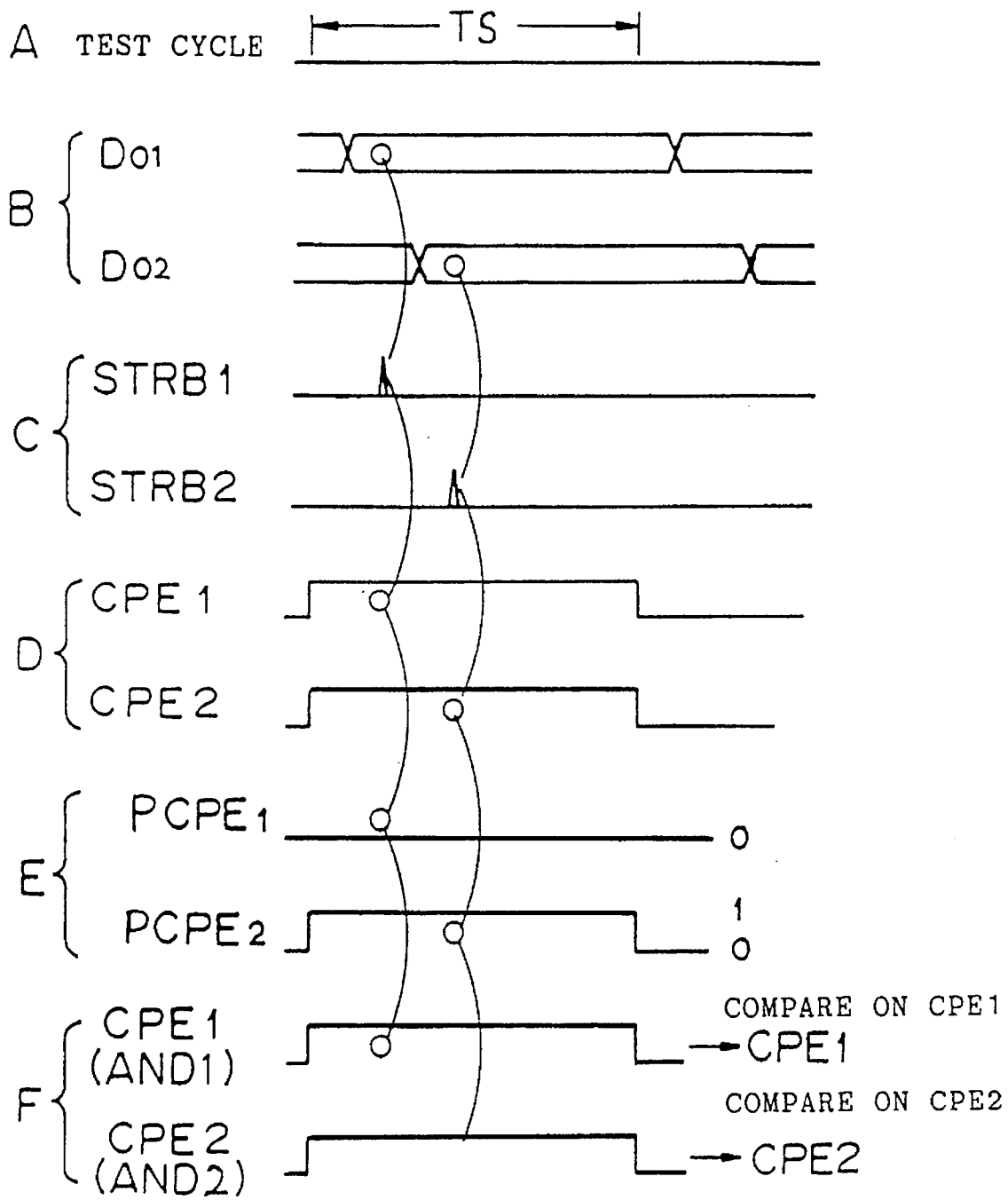
FIG. 19 is a timing chart for illustrating the operation in in the multiplex mode shown in FIG. 18.

As indicated above, according to the multiplex mode, the comparison results on either the strobe STRB1 or STRB2 may be selectively output in real time at the logic comparator sections $30_1$, $30_2$, ... $30_N$ depending on the logics of the pin control signals $PCPE_1$–$PCPE_N$. Generally, the response speed of a particular IC under test may be known as a response property relative to other IC's by measuring the electric current of the power source circuit of said particular IC. If an IC ($D_{02}$) having a slow response speed is included among IC's under test $10_1$–$10_N$ as shown in the Row B in FIG. 19, for example, the gate AND4 is controlled to be opened in the mode switching circuit $8_2$ by shifting the control signal PCPE2 of said IC slow in response speed to "1" as as shown in Row E in FIG. 19. The comparison control signal CPE2 is thus selected and applied to the AND gate AND2, and in the logic comparator section $30_2$ the logic extracted by the strobe STRB2 of slow timing may be compared with the expected value EXP2 in the test cycle ST. In other words, IC's having different response times may be simultaneously tested by the use of strobes having correspondingly different timings.

Figure 3:
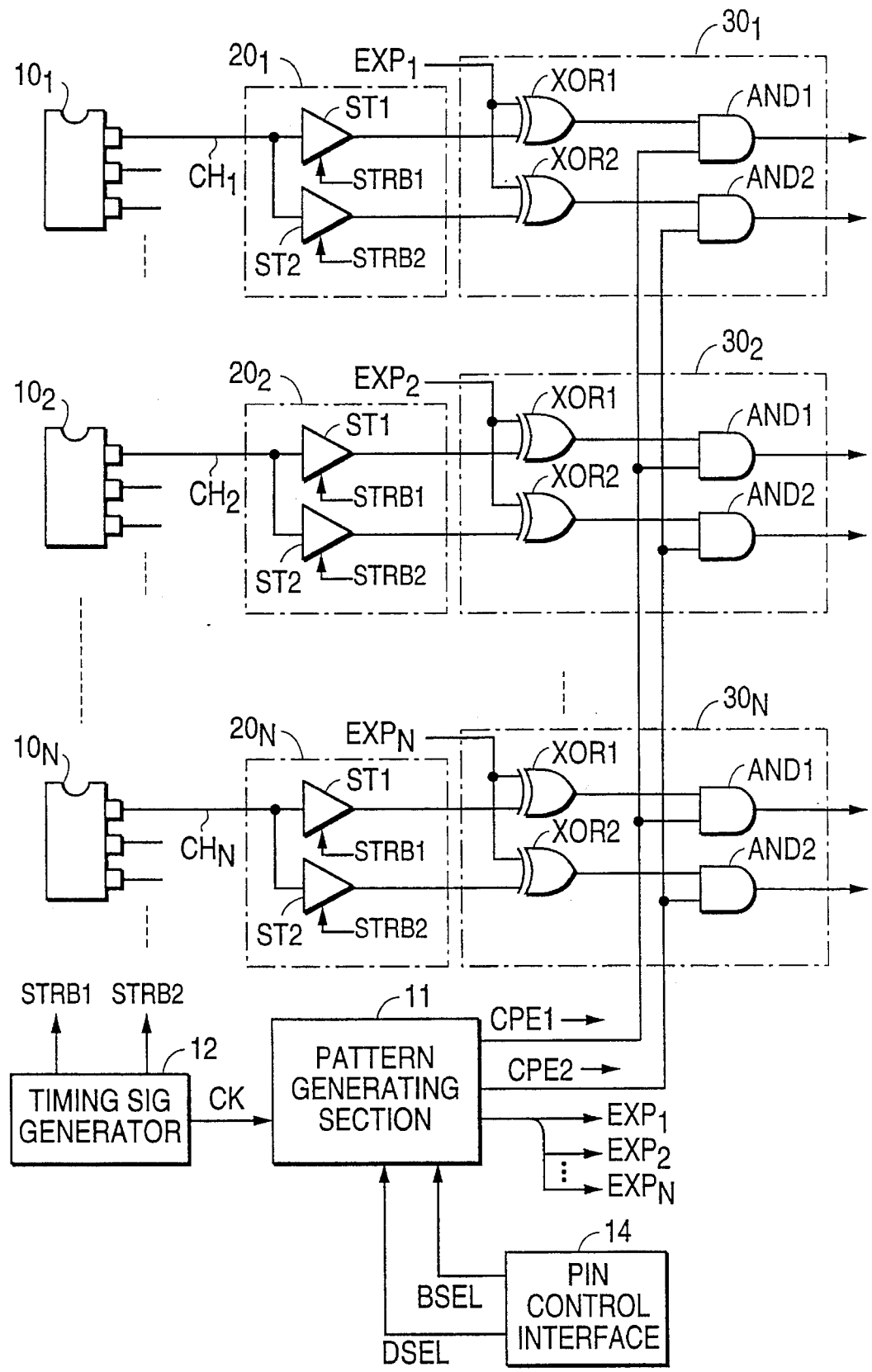
FIG. 3 is a connection diagram illustrating a plurality of IC's being tested.

When the mode switching signals CONT1, CONT2 and CONT3 are set to "0", "0" and "1", respectively, only the comparison control signals CPE1 and CPE2 become effective, as in the case of FIG. 11. This mode is the same as that of the prior art described above with reference to FIG. 3.

Figure 20:
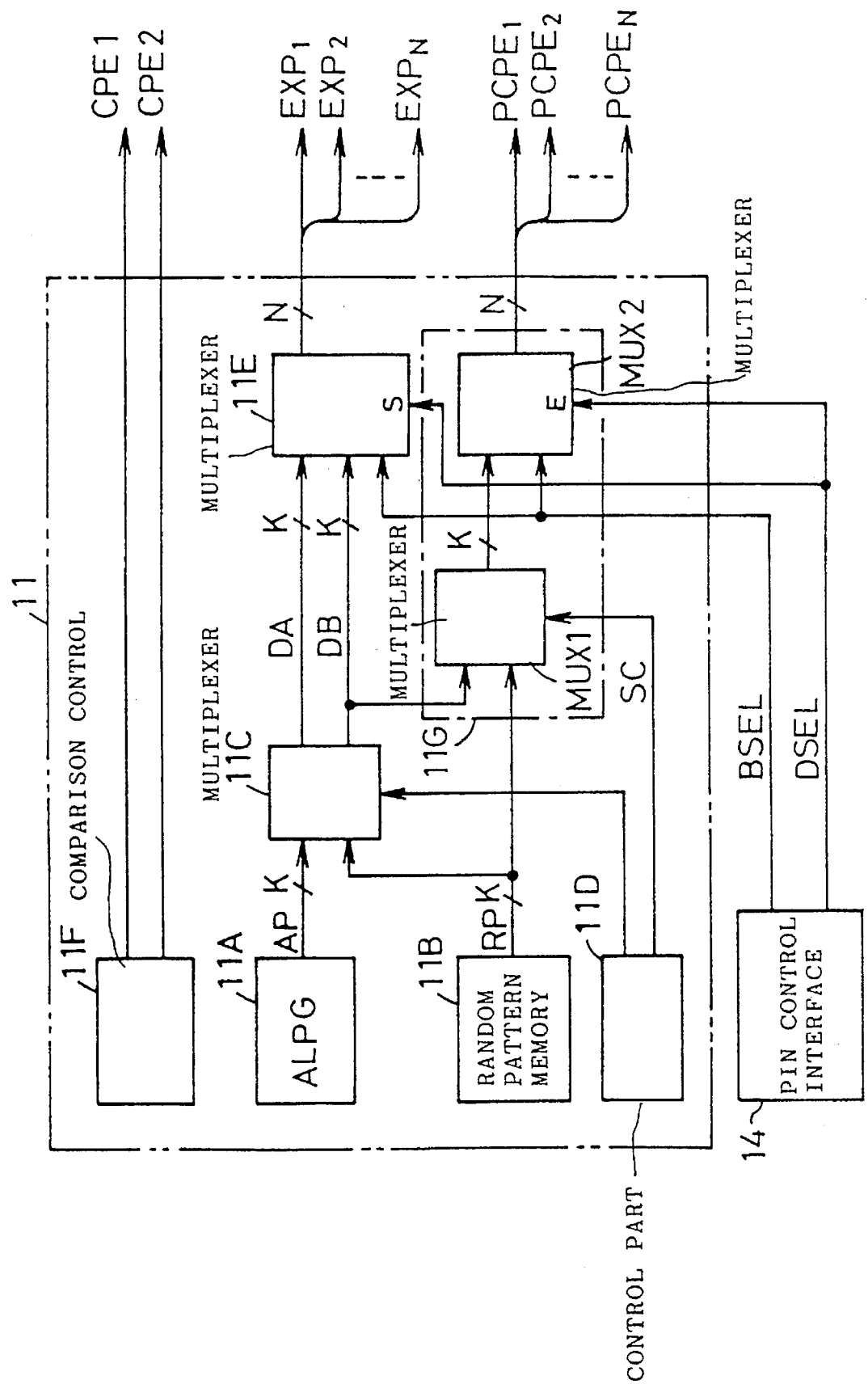
FIG. 20 is a block diagram of the pattern generating section illustrating the construction of the expected value generator 11G in the embodiments of FIGS. 4 and 16.

FIG. 20 is a block diagram showing the pattern generating section 11 including a pin control signal generator 11G to illustrate an example of the arrangement of the pin control signal generator as used in the embodiments of FIGS. 4 and 16. The operation of the algorithmic pattern generator 11A, the random pattern memory 11B, multiplexers 11C, 11E, the control part 11D, etc. will not be described as it is the same as described with reference to in FIG. 1.

In the embodiment of FIG. 20, the pin control signal generator 11G comprises multiplexers MUX1 and MUX2. The multiplexer MUX1 is supplied with one of the output data DB from the multiplexer 11C and the random pattern data RP from the random pattern memory 11B, and selects and outputs either one to the multiplexer MUX2 in accordance with the selection control signal SC. The multiplexer MUX2 is supplied with the same bit selection signal BSEL and data selection signal DSEL as are provided to the multiplexer 11E from the pin control interface 14, and selects a desired bit in the input pattern data for each of the individual test channels and enables outputting, as a pin control signal, the data at a bit position selected in accordance with said signal BSEL when the data selection signal DSEL given to the corresponding test channel represents the selection of data DA (when the DSEL is "1"). In the case where the data selection signal DSEL represents the selection of data DB, outputting of the selected bit data is inhibited. In this way, pin control signals $PCPE_1$–$PCPE_N$ corresponding to N channels may be obtained.

The operation modes of the pin control signal generator 11G include the mode where the random pattern data RP read out from the random pattern memory 11B by the multiplexer MUX1 is selected and the mode where the data DB from the multiplexer 11C is selected. The bit specified in the multiplexer MUX2 by the bit selection signal BSEL in the input pattern data for every individual channel is either output or inhibited depending on whether the data selection signal DSEL given to a corresponding channel is "1" or "0".

What is important in the embodiment of FIG. 20 is that multiplexer MUX1 makes it possible to select either one of the random pattern data RP from the random pattern memory 11B and the pattern data DB from the multiplexer 11C. This increases the diversity of pin control signal patterns which may be produced.

What is of second importance is that the bit selection signal BSEL is provided to both the multiplexer 11E and multiplexer MUX1 in common. This insures that there is a coincidence between the bit position of the input data selected for each channel in the multiplexer 11E and the bit position of the input data selected for each channel in the multiplexers MUX2, so that corresponding relationship is established between the expected values $EXP_1$–$EXP_N$ for the channels $CH_1$–$CH_N$ and the pin control signals $PCPE_1$–$PCPE_N$, which makes it easy to prepare programs for making decision on the pattern generating sequence of the algorithmic pattern generator 11A and programs for making decision on the sequence of reading out of the random pattern memory 11B.

As described hereinabove, according to this invention, a pin control signal $PCPE_1$–$PCPE_N$ corresponding to each of the individual test channels $CH_1$–$CH_N$ is generated, and mode switching circuits $8_1$–$8_N$ are provided. In the mode switching circuits $8_1$–$8_N$ the outputs of common comparison control are controlled by the corresponding pin control signals so that the the logic comparison operation in each logic comparator $30_1$, $30_2$, . . . $30_N$ may be controlled for each of the individual test channels. Accordingly, it is possible to test even IC's having different output conditions for individual pins. The advantage is thus provided that sophisticated IC's may be tested. In addition, the mode switching circuits may be controlled by the mode switching signals to conduct logic comparisons on the individual test channels in the multiplex mode, masking mode, individual pin control mode, conventional mode, and exclusive-OR mode.

By way of example, according to the masking mode, if a defect is detected on an memory IC 10 being tested and if the address at which said defect has been detected is again accessed, the comparison result concerned may be masked so that the test may be continued to find out whether there is another defective address. If another defective address is detected, said address may be masked so that the test may be continued to find out whether there is a defect at still another address. By counting the number of defective addresses detected, even the IC tester for use in a mass production application equipped with no failure analysis memory may find the number of defective addresses of an IC which were determined to be defective without the need for altering the test program. If a defect is detected on an IC associated with a particular channel when a number of IC's are simultaneously being tested, the test on the other IC's may be continued by masking the comparison result of said particular channel.

According to the multiplex mode, either one of the strobes STRB1 and STRB2 may be arbitrarily selected for every individual IC $10_1$–$10_N$ to be tested. In the case of simultaneous testing of a multiplicity of IC's, therefore, even if there is an IC which is slow in response, the logic comparison concerned with said slow response IC may be effected by the logic which has been extracted by the strobe STRB2 having a slower timing. In this manner, since either one of the strobes STRB1 and STRB2 may be arbitrarily selected for every individual IC $10_1$–$10_N$ to be tested, during the simultaneous testing of a multiplicity of IC's, it is possible to test all the IC's even if there are some IC's slow in response and some fast in response.

Moreover, this invention also permits the testing operation in the conventional testing mode, since the mode switching circuits $8_1$–$8_N$ enable the conventional mode to be set as well. It is thus to be appreciated that the present invention permits IC testing in the various modes of operation, thereby enhancing the flexibility of this IC tester.

I claim:

1. An IC tester having a plurality of test channels, each including a level/timing comparator section for performing a logic decision on a level of an input signal supplied thereto at a desired timing, and a logic comparator section, receiving a signal obtained as a result of the logic decision in said level/timing comparator section, for logically comparing said signal with an expected value signal generated by pattern generating means and for outputting therefrom or inhibiting a signal obtained as a result of the logic comparison therein from being output in accordance with a comparison control signal generated by comparison control signal generating means, said IC tester comprising:

pin control signal generating means for producing a pin control signal corresponding to each of the test channels;

mode switching signal generating means associated with each of the test channels for generating a mode switching signal; and mode switching/logic operation means, associated with each of the test channels, for receiving the comparison control signal from the comparison control signal generating means, an associated pin control signal from said pin control signal generating means, and an associated mode switching signal from said mode switching signal generating means, for determining whether or not to supply the received comparison control signal to the logic comparator section of an associated test channel.

2. The IC tester as set forth in claim 1, wherein each of said mode switching/logic operation means alters the received comparison control signal to one of two logics in accordance with the received mode switching signal.

3. The IC tester as set forth in claim 1, wherein said mode switching signals include a first mode switching signal, each of said mode switching/logic operation means includes an OR circuit for taking a logical OR of said first mode switching signal and said comparison control signal to produce an altered comparison control signal, and a gate circuit for outputting or inhibiting said altered comparison control signal from being output in accordance with said pin control signal.

4. The IC tester as set forth in claim 3, wherein said mode switching signals include a second mode switching signal, and each of said mode switching/logic operation means includes a logic inversion circuit for inverting the logic of said pin control signal to be applied to said gate circuit in accordance with said second mode switching signal.

5. The IC tester as set forth in claim 1, wherein said mode switching signals include a first mode switching signal and said comparison control signal includes first and second comparison control signals, and wherein said level/timing comparator section and said logic comparator section of each of said test channels comprises:

first level comparator means for effecting a logic decision at a timing of a first strobe;

first logic comparator means for logically comparing a signal obtained as a result of the logic decision in said first level comparator means with said expected value signal and outputting therefrom or inhibiting a signal obtained as a result of the logic comparison therein from being output in accordance with said first comparison control signal;

second level comparator means for effecting a logic decision at a timing of a second strobe; and second logic comparator means for logically comparing a signal obtained as a result of the logic decision in said second level comparator means with said expected value signal and outputting therefrom or inhibiting a signal obtained as a result of the logic comparison therein from being output in accordance with said second comparison control signal.

6. The IC tester as set forth in claim 5, wherein each of said mode switching/logic operation means comprises:

first and second OR circuits for taking a logical OR of said first comparison control signal and said first mode switching signal and for taking a logical OR of said second comparison control signal and said first mode switching signal, respectively; and first and second gates for controlling whether to supply the outputs of said first and second OR circuits to said first and second logic comparator means or not in accordance with said associated pin control signal, respectively.

7. The IC tester as set forth in claim 6, wherein said mode switching signals include a second mode switching signal, and further including logic inversion means for inverting the logic of said pin control signal to be applied to said first gate in accordance with said second mode switching signal.

8. The IC tester as set forth in claim 7, wherein said mode switching signals include a third mode switching signal and further including a third OR circuit for altering said pin control signal being applied to said logic inversion means and said second OR circuit to one of two logics in accordance with said third mode switching signal.

9. The IC tester as set forth in claim 6, wherein each of said mode switching/logic operation means comprises:

first and second exclusive-OR circuits for taking a logical OR between the output of said first OR circuit and said pin control signal and for taking a logical OR between the output of said second OR circuit and said pin control signal, respectively;

first selector means for selecting either one of the output of said first gate and the output of said first exclusive-OR circuit to apply a selected output to said first logic comparator means; and second selector means for selecting either one of the output of said second gate and the output of said second exclusive-OR circuit to apply a selected output to said second logic comparator means, said first and second selector means being adapted to be controlled in accordance with a fourth mode switching signal generated by said mode switching signal generating means of the associated test channel.

10. The IC tester as set forth in claim 7, wherein each of said mode switching/logic operation means comprises:

first and second exclusive-OR circuits for taking a logical OR between the output of said first OR circuit and said pin control signal and for taking a logical OR between the output of said second OR circuit and said pin control signal, respectively;

first selector means for selecting either one of the output of said first gate and the output of said first exclusive-OR circuit to apply a selected output to said first logic comparator means; and second selector means for selecting either one of the output of said second gate and the output of said second exclusive-OR circuit to apply a selected output to said second logic comparator means, said first and second selector means being adapted to be controlled in accordance with a fourth mode switching signal generated by said mode switching signal generating means of the associated test channel.

11. The IC tester as set forth in claim 6, wherein each of said mode switching/logic operation means comprises:

first and second exclusive-OR circuits for taking a logical OR between the output of said first OR circuit and said pin control signal and for taking a logical OR between the output of said second OR circuit and said pin control signal, respectively;

first selector means for selecting either one of the output of said first gate and the output of said first exclusive-OR circuit to apply a selected output to said first logic comparator means; and second selector means for selecting either one of the output of said second gate and the output of said second exclusive-OR circuit to apply a selected output to said second logic comparator means, said first and second selector means being adapted to be controlled in accordance with a fourth mode switching signal generated by said mode switching signal generating means of the associated test channel.

12. The IC tester as set forth in claim 1, wherein said pattern generating means comprises:

algorithmic pattern generating means for generating algorithmic pattern data by a logic operation;

random pattern memory means having random pattern data prestored therein;

first multiplexer means for producing expected value pattern data from said algorithmic pattern data and said random pattern data;

second multiplexer means for producing an expected value signal corresponding to each of said test channels from said expected value pattern data;

third multiplexer means adapted to receive the random pattern data from said random pattern memory means and the expected value pattern data from said first multiplexer means and to select either one of said random pattern data and said expected value pattern data in accordance with a selection control signal and to output a selected data; and fourth multiplexer means for producing a pin control signal corresponding to each of said test channels from the output of said third multiplexer means.

13. The IC tester as set forth in claim 12, wherein said second and fourth multiplexer means are adapted to output bits of input data specified by a common bit selection signal as said expected value signal and said pin control signal of the associated test channel, respectively.

14. The IC tester as set forth in claim 13, wherein said expected value pattern data contains first and second data, said second multiplexer means being adapted to select either one of said first and second data in accordance with a data selection signal, and wherein said fourth multiplexer means is adapted to enable said pin control signal corresponding to each of said test channels to be output in accordance with said data selection signal.

15. The IC tester as set forth in claim 1, wherein said test channels have each of their inputs connected to a corresponding one of a plurality of output pins of a single IC to be tested.

16. The IC tester as set forth in claim 1, wherein said test channels have each of their inputs connected to at least one output pin of a corresponding one of a plurality of IC's to be tested, said at least one output pin of each IC being in one-to-one correspondence.

\* \* \* \* \*

UNITED STATES PATENT AND TRADEMARK OFFICE
CERTIFICATE OF CORRECTION

PATENT NO. : 5,579,251
DATED : November 26, 1996
INVENTOR(S) : Kazuhiko SATO

It is certified that error appears in the above-indentified patent and that said Letters Patent is hereby corrected as shown below:

Column 2

Line 60, "$(21_{CL}, 21S_{L1}, 21S_{H2}, 31_{H1}, 31_{H2})$" should be --$(21C_H, 21S_{H2}, 31_{H1}, 31_{H2})$--;

Line 61, "$(21C_L, 21S_{L1}, 21S_{L2}, 31_{L1}, B1_{L2})$" should be --$(21C_L, 21S_{L1}, 21S_{L2}, 31_{L1}, 31_{L2})$--.

Column 3

Line 4, insert paragraph indentation before "As";

Line 20, "HAND gate B4," should be --NAND gate 34,--.

Column 6

Line 21, "ANDS" should be --AND4--

Line 42, "ANDS" should be --AND3--;

Line 45, "AND3" should be --AND4--.

Column 7

Line 39, "Inorder" should be --In order--.

Column 9

Line 54, "$PCPE_{N1}$" should be --$PCPE_N$--.

Column 10

Line 9, "$CONT_4$" should be --CONT4--;

Line 45, "(IC's 10, $10_1$-$10_N$ being tested)" should be --(IC's $10_1$-$10_N$ being tested)--.

UNITED STATES PATENT AND TRADEMARK OFFICE
CERTIFICATE OF CORRECTION

PATENT NO. : 5,579,251
DATED : November 26, 1996
INVENTOR(S) : Kazuhiko SATO

It is certified that error appears in the above-indentified patent and that said Letters Patent is hereby corrected as shown below:

Column 14

Line 40, "signal and" should be --signal, and--.

Signed and Sealed this

Fourth Day of March, 1997

*Attest:*

BRUCE LEHMAN

*Attesting Officer*   Commissioner of Patents and Trademarks